(12) United States Patent
Lewis, II et al.

(10) Patent No.: US 8,901,438 B2
(45) Date of Patent: Dec. 2, 2014

(54) ELECTRONIC EQUIPMENT CABINET STRUCTURE

(75) Inventors: Richard Evans Lewis, II, Austin, TX (US); Jose Arturo Garza, Jr., Pflugerville, TX (US); D. Brian Donowho, Austin, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 167 days.

(21) Appl. No.: 13/229,704

(22) Filed: Sep. 10, 2011

(65) Prior Publication Data
US 2012/0062084 A1 Mar. 15, 2012

Related U.S. Application Data

(60) Provisional application No. 61/381,904, filed on Sep. 10, 2010.

(51) Int. Cl.
| | | |
|---|---|---|
| *H01R 13/502* | (2006.01) | |
| *H05K 5/00* | (2006.01) | |
| *H05K 7/18* | (2006.01) | |
| *H05K 5/02* | (2006.01) | |

(52) U.S. Cl.
CPC ............... *H05K 7/18* (2013.01); *H05K 5/0234* (2013.01)
USPC .............................. 174/559; 174/50; 174/560

(58) Field of Classification Search
CPC .............................. H02G 3/081; H01G 4/224
USPC ............................................ 174/50, 559, 560
See application file for complete search history.

(56) References Cited

U.S. PATENT DOCUMENTS

| 1,129,040 A | 2/1915 | McClure |
| 1,919,166 A | 7/1933 | Lavarack |

(Continued)

FOREIGN PATENT DOCUMENTS

| AU | 2008254682 | 11/2012 |
| CN | 102177633 A | 9/2011 |

(Continued)

OTHER PUBLICATIONS

Chatsworth Products, Inc., "Thermal Management Solutions", Signature Solutions Brochure, Revision dated Mar. 2008, 6 pages, www.chatsworth.com/passivecooling.

(Continued)

*Primary Examiner* — Timothy Thompson
*Assistant Examiner* — Sherman Ng
(74) *Attorney, Agent, or Firm* — Tillman Wright, PLLC; James D. Wright; David R. Higgins

(57) ABSTRACT

An electronic equipment cabinet structure includes a frame having a plurality of vertical support posts and a plurality of cross members that connect the support posts together. In one aspect, the cabinet structure further includes at least one caster plate connected to one of the plurality of cross members. In another aspect, the cabinet structure further includes at least one bracket having a base and two sides extending in the same direction away from the base, the edges of the two sides being connected to one of the cross members and the base being connected to one of the vertical support posts. In still another aspect, the cabinet structure further includes at least one bracket connected to one of the vertical support posts, wherein the bracket includes a first embossed portion nested within a corresponding second embossed portion on the vertical support post to which the bracket is connected.

20 Claims, 15 Drawing Sheets

(56) References Cited

U.S. PATENT DOCUMENTS

| | | | |
|---|---|---|---|
| 2,039,886 A | 5/1936 | Cohn | |
| 2,424,217 A | 7/1947 | Bales | |
| 2,459,953 A | 1/1949 | Mills | |
| 2,616,142 A | 11/1952 | Tinnerman | |
| 2,667,368 A | 1/1954 | Ferguson | |
| 2,756,369 A | 7/1956 | Gorrie | |
| 2,880,379 A | 3/1959 | Stoddart et al. | |
| 2,999,190 A | 9/1961 | Armandroff et al. | |
| 3,034,844 A | 5/1962 | Anderson et al. | |
| 3,143,195 A | 8/1964 | Schroeder | |
| 3,192,306 A | 6/1965 | Skonnord | |
| 3,265,419 A | 8/1966 | Durnbaugh et al. | |
| 3,404,931 A | 10/1968 | Fall et al. | |
| 3,563,627 A | 2/1971 | Whipps | |
| 3,585,333 A | 6/1971 | Valle et al. | |
| 3,655,254 A * | 4/1972 | Mayer et al. | 312/265.4 |
| 3,675,955 A * | 7/1972 | Hajduk | 217/65 |
| 4,040,694 A * | 8/1977 | Lascarrou | 312/263 |
| 4,101,233 A | 7/1978 | McConnell | |
| 4,148,453 A | 4/1979 | Brantly | |
| 4,495,234 A | 1/1985 | Tominaga et al. | |
| 4,497,411 A | 2/1985 | DeBortoli | |
| 4,551,577 A | 11/1985 | Byrne | |
| 4,553,674 A | 11/1985 | Yoshikawa et al. | |
| 4,592,602 A | 6/1986 | Kuster et al. | |
| 4,643,319 A | 2/1987 | Debus et al. | |
| 4,715,502 A * | 12/1987 | Salmon | 211/26 |
| 4,825,339 A | 4/1989 | Boudon | |
| 4,869,380 A | 9/1989 | Metcalfe et al. | |
| 4,941,717 A | 7/1990 | Beaulieu | |
| 4,944,082 A | 7/1990 | Jones et al. | |
| 4,962,443 A | 10/1990 | Cole | |
| 4,964,020 A | 10/1990 | Savage et al. | |
| 4,988,008 A | 1/1991 | Blum et al. | |
| 4,997,240 A * | 3/1991 | Schmalzl et al. | 312/265.4 |
| 5,004,107 A | 4/1991 | Sevier et al. | |
| 5,009,383 A | 4/1991 | Chapman | |
| 5,020,866 A | 6/1991 | McIlwraith | |
| 5,052,565 A | 10/1991 | Zachrei | |
| 5,149,026 A | 9/1992 | Allen | |
| 5,165,770 A | 11/1992 | Hahn | |
| 5,250,752 A | 10/1993 | Cutright | |
| 5,263,252 A | 11/1993 | Bruggink | |
| 5,275,296 A | 1/1994 | Zachrai | |
| 5,284,254 A | 2/1994 | Rinderer | |
| 5,294,748 A | 3/1994 | Schwenk et al. | |
| 5,310,255 A * | 5/1994 | Ranallo | 312/334.5 |
| 5,323,916 A | 6/1994 | Salmon | |
| 5,333,950 A | 8/1994 | Zachrai | |
| 5,372,262 A | 12/1994 | Benson et al. | |
| 5,380,083 A | 1/1995 | Jones et al. | |
| 5,380,803 A * | 1/1995 | Coutant et al. | 525/240 |
| 5,460,441 A | 10/1995 | Hastings et al. | |
| 5,488,543 A | 1/1996 | Mazura et al. | |
| 5,497,444 A | 3/1996 | Wheeler | |
| 5,498,073 A | 3/1996 | Charbonneau et al. | |
| 5,536,079 A | 7/1996 | Kostic | |
| 5,540,339 A | 7/1996 | Lerman | |
| 5,542,549 A | 8/1996 | Siemon et al. | |
| 5,566,836 A * | 10/1996 | Lerman | 211/26 |
| 5,586,012 A | 12/1996 | Lerman | |
| 5,639,150 A | 6/1997 | Anderson et al. | |
| 5,640,482 A | 6/1997 | Barry et al. | |
| 5,695,263 A * | 12/1997 | Simon et al. | 312/265.4 |
| 5,713,651 A * | 2/1998 | Essig et al. | 312/265.4 |
| 5,728,973 A | 3/1998 | Jorgensen | |
| 5,758,002 A | 5/1998 | Walters | |
| 5,791,498 A | 8/1998 | Mills | |
| 5,798,485 A | 8/1998 | Rohde et al. | |
| 5,806,945 A | 9/1998 | Anderson et al. | |
| 5,806,946 A | 9/1998 | Benner et al. | |
| 5,819,956 A | 10/1998 | Rinderer | |
| 5,933,563 A | 8/1999 | Schaffer et al. | |
| 5,938,302 A | 8/1999 | Anderson et al. | |
| 5,954,525 A | 9/1999 | Siegal et al. | |
| 5,961,081 A | 10/1999 | Rinderer | |
| 5,975,315 A | 11/1999 | Jordan | |
| 5,992,808 A | 11/1999 | Morrow | |
| 5,997,117 A | 12/1999 | Krietzman | |
| 6,008,621 A | 12/1999 | Madison et al. | |
| 6,011,221 A | 1/2000 | Lecinski et al. | |
| 6,019,446 A | 2/2000 | Laboch et al. | |
| 6,036,290 A | 3/2000 | Jancsek et al. | |
| 6,039,420 A | 3/2000 | Besserer et al. | |
| 6,044,193 A | 3/2000 | Szentesi et al. | |
| 6,047,838 A | 4/2000 | Rindoks et al. | |
| 6,065,612 A | 5/2000 | Rinderer | |
| 6,067,233 A | 5/2000 | English et al. | |
| 6,095,345 A | 8/2000 | Gibbons | |
| 6,103,973 A | 8/2000 | Sharp | |
| 6,118,073 A * | 9/2000 | Lau et al. | 174/66 |
| 6,123,203 A | 9/2000 | Gibbons | |
| 6,123,400 A | 9/2000 | Nicolai et al. | |
| 6,135,583 A | 10/2000 | Simon et al. | |
| 6,155,658 A | 12/2000 | Woodward et al. | |
| 6,179,398 B1 | 1/2001 | Martin | |
| 6,181,549 B1 | 1/2001 | Mills et al. | |
| 6,185,098 B1 | 2/2001 | Benavides | |
| 6,201,919 B1 | 3/2001 | Puetz et al. | |
| D440,210 S | 4/2001 | Larsen et al. | |
| 6,223,908 B1 | 5/2001 | Kurtsman | |
| 6,231,142 B1 | 5/2001 | Pochet | |
| 6,238,029 B1 | 5/2001 | Marzec et al. | |
| 6,245,998 B1 | 6/2001 | Curry et al. | |
| 6,254,207 B1 * | 7/2001 | Leneutre | 312/263 |
| 6,282,854 B1 | 9/2001 | Vos et al. | |
| 6,293,637 B1 | 9/2001 | Anderson et al. | |
| 6,299,268 B1 | 10/2001 | Carle et al. | |
| 6,313,405 B1 | 11/2001 | Rinderer | |
| 6,315,132 B1 | 11/2001 | Hartel et al. | |
| 6,321,917 B1 | 11/2001 | Mendoza | |
| 6,327,150 B1 | 12/2001 | Levy et al. | |
| 6,340,141 B1 | 1/2002 | Rinderer | |
| 6,347,714 B1 | 2/2002 | Fournier et al. | |
| 6,349,837 B1 | 2/2002 | Serban | |
| 6,401,940 B1 | 6/2002 | Hartel et al. | |
| 6,410,844 B1 | 6/2002 | Bruner et al. | |
| 6,422,399 B1 | 7/2002 | Castillo et al. | |
| 6,425,488 B1 | 7/2002 | Notohardjono et al. | |
| 6,425,648 B1 | 7/2002 | Notohardjono et al. | |
| 6,481,582 B1 | 11/2002 | Rinderer | |
| 6,489,565 B1 | 12/2002 | Krietzman et al. | |
| 6,502,702 B1 | 1/2003 | Hsue et al. | |
| 6,504,100 B2 | 1/2003 | Lawrence et al. | |
| 6,510,589 B2 | 1/2003 | Schrage | |
| 6,513,770 B1 | 2/2003 | Franz et al. | |
| 6,517,174 B2 | 2/2003 | Sevier | |
| 6,527,351 B1 | 3/2003 | Sevier et al. | |
| 6,541,705 B1 | 4/2003 | McGrath | |
| 6,554,697 B1 | 4/2003 | Koplin | |
| 6,561,602 B1 | 5/2003 | Sevier et al. | |
| 6,565,166 B1 | 5/2003 | Bulk et al. | |
| 6,570,754 B2 | 5/2003 | Foley et al. | |
| 6,601,932 B1 | 8/2003 | Helgenberg et al. | |
| 6,605,777 B1 | 8/2003 | Anderson et al. | |
| 6,605,782 B1 | 8/2003 | Krietzman et al. | |
| 6,629,505 B1 | 10/2003 | Cronk et al. | |
| 6,632,999 B2 | 10/2003 | Sempliner et al. | |
| 6,655,534 B2 | 12/2003 | Williams et al. | |
| 6,695,149 B1 | 2/2004 | Cote et al. | |
| 6,760,531 B1 | 7/2004 | Solheid et al. | |
| 6,769,551 B2 | 8/2004 | Rafferty et al. | |
| 6,785,459 B2 | 8/2004 | Schmidt et al. | |
| 6,788,535 B2 | 9/2004 | Dodgen et al. | |
| 6,791,841 B1 | 9/2004 | Tirrell et al. | |
| 6,796,437 B2 | 9/2004 | Krampotich et al. | |
| 6,796,438 B2 | 9/2004 | Mendoza | |
| 6,796,623 B1 | 9/2004 | Fontana et al. | |
| 6,808,240 B2 | 10/2004 | Altena | |
| 6,814,417 B2 | 11/2004 | Hartel et al. | |
| 6,866,154 B2 | 3/2005 | Hartman et al. | |
| 6,884,942 B2 | 4/2005 | McGrath et al. | |
| 6,902,069 B2 | 6/2005 | Hartman et al. | |
| 6,920,038 B2 | 7/2005 | Gehlbach | |

(56) References Cited

U.S. PATENT DOCUMENTS

| | | |
|---|---|---|
| 6,930,886 B2 | 8/2005 | Velez et al. |
| 6,945,616 B2 | 9/2005 | Webster et al. |
| 6,992,247 B2 | 1/2006 | Rasmussen et al. |
| 7,000,784 B2 | 2/2006 | Canty et al. |
| 7,086,707 B2 | 8/2006 | Wyatt et al. |
| 7,093,725 B2 | 8/2006 | Hartman et al. |
| 7,141,891 B2 | 11/2006 | McNally et al. |
| 7,144,320 B2 | 12/2006 | Turek et al. |
| 7,168,576 B2 | 1/2007 | Williams |
| 7,178,679 B2 | 2/2007 | Canty et al. |
| 7,188,735 B2 | 3/2007 | Nakagawa et al. |
| 7,204,371 B2 | 4/2007 | Woolsey et al. |
| 7,255,409 B2 | 8/2007 | Hu et al. |
| 7,255,640 B2 | 8/2007 | Aldag et al. |
| 7,285,027 B2 | 10/2007 | McGrath et al. |
| 7,293,666 B2 | 11/2007 | Mattlin et al. |
| 7,316,461 B2 | 1/2008 | Wyatt et al. |
| 7,355,115 B2 | 4/2008 | Liang |
| 7,362,941 B2 | 4/2008 | Rinderer et al. |
| 7,364,243 B2 | 4/2008 | Wyatt et al. |
| 7,378,046 B2 | 5/2008 | Canty et al. |
| 7,406,242 B1 | 7/2008 | Braga |
| 7,425,678 B2 | 9/2008 | Adducci et al. |
| 7,427,713 B2 | 9/2008 | Adducci et al. |
| 7,438,638 B2 | 10/2008 | Lewis et al. |
| 7,458,859 B2 | 12/2008 | McGrath et al. |
| D584,251 S | 1/2009 | Lewis, II et al. |
| D584,252 S | 1/2009 | Lewis, II et al. |
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,495,169 B2 | 2/2009 | Adducci et al. |
| D588,081 S | 3/2009 | Lewis, II et al. |
| 7,498,512 B2 | 3/2009 | Adducci et al. |
| 7,504,581 B2 | 3/2009 | Adducci et al. |
| 7,507,912 B1 | 3/2009 | Sempliner et al. |
| D592,618 S | 5/2009 | Lewis, II et al. |
| 7,542,287 B2 | 6/2009 | Lewis, II et al. |
| D596,928 S | 7/2009 | Lawrence et al. |
| 7,637,771 B2 | 12/2009 | Laursen |
| 7,643,291 B2 | 1/2010 | Mallia et al. |
| D611,326 S | 3/2010 | Alaniz et al. |
| 7,697,285 B2 | 4/2010 | Donowho et al. |
| 7,718,889 B2 | 5/2010 | Rasmussen et al. |
| 7,718,891 B2 | 5/2010 | Adducci et al. |
| 7,719,835 B1 | 5/2010 | Schluter |
| 7,746,637 B2 | 6/2010 | Donowho et al. |
| 7,772,489 B2 | 8/2010 | Adducci et al. |
| 7,778,513 B2 | 8/2010 | Rinderer et al. |
| 7,795,532 B2 | 9/2010 | Walker |
| 7,804,685 B2 | 9/2010 | Krietzman |
| 7,839,635 B2 | 11/2010 | Donowho et al. |
| 7,874,433 B2 | 1/2011 | Levesque et al. |
| 7,878,888 B2 | 2/2011 | Rasmussen et al. |
| 7,880,084 B2 | 2/2011 | Adducci et al. |
| 7,893,356 B2 | 2/2011 | Garza et al. |
| 7,894,190 B2 | 2/2011 | Davis et al. |
| 7,939,763 B2 | 5/2011 | Jones et al. |
| 7,952,869 B2 | 5/2011 | Lewis, II et al. |
| 7,957,139 B2 | 6/2011 | Davis et al. |
| 7,973,242 B2 | 7/2011 | Jones et al. |
| 7,974,105 B2 | 7/2011 | Dean et al. |
| 7,999,183 B2 | 8/2011 | Garza et al. |
| 8,003,890 B2 | 8/2011 | Donowho et al. |
| 8,035,965 B2 | 10/2011 | Adducci et al. |
| 8,040,673 B2 | 10/2011 | Krietzman |
| 8,049,109 B2 | 11/2011 | Sempliner et al. |
| 8,087,979 B2 | 1/2012 | Rasmussen |
| 8,107,238 B2 | 1/2012 | Krietzman et al. |
| 8,138,419 B2 | 3/2012 | Garza et al. |
| 8,281,940 B2 | 10/2012 | Fan |
| 8,330,043 B2 | 12/2012 | Alaniz et al. |
| 8,395,046 B2 | 3/2013 | Nicewicz et al. |
| 8,403,736 B2 | 3/2013 | Rasmussen et al. |
| 8,405,984 B2 | 3/2013 | Donowho et al. |
| 8,411,465 B2 | 4/2013 | Dean, Jr. et al. |
| 8,437,147 B2 | 5/2013 | Dean, Jr. et al. |
| 8,443,987 B2 | 5/2013 | Peng et al. |
| 8,459,756 B2 | 6/2013 | Linhares et al. |
| 8,653,363 B2 | 2/2014 | Behrens et al. |
| 8,730,665 B2 | 5/2014 | Lewis, II et al. |
| 2001/0015598 A1 | 8/2001 | Sevier |
| 2002/0046979 A1 | 4/2002 | Larsen et al. |
| 2002/0074149 A1 | 6/2002 | Lawrence et al. |
| 2002/0197045 A1 | 12/2002 | Schmidt et al. |
| 2003/0037953 A1 | 2/2003 | Sarkinen et al. |
| 2003/0118311 A1 | 6/2003 | Thibault et al. |
| 2004/0007372 A1 | 1/2004 | Krietzman et al. |
| 2004/0016708 A1 | 1/2004 | Rafferty et al. |
| 2004/0016713 A1 | 1/2004 | Wyatt et al. |
| 2004/0020873 A1 | 2/2004 | Henderson |
| 2004/0050808 A1 | 3/2004 | Krampotich et al. |
| 2004/0069725 A1 | 4/2004 | Adducci et al. |
| 2004/0146266 A1 | 7/2004 | Solheid et al. |
| 2004/0173545 A1 | 9/2004 | Canty et al. |
| 2004/0183409 A1 | 9/2004 | Rinderer |
| 2004/0190270 A1 | 9/2004 | Aldag et al. |
| 2004/0201335 A1 | 10/2004 | Davis |
| 2004/0226900 A1 | 11/2004 | Canty et al. |
| 2004/0231875 A1 | 11/2004 | Rasmussen et al. |
| 2005/0221683 A1 | 10/2005 | McGrath et al. |
| 2005/0247650 A1 | 11/2005 | Vogel et al. |
| 2006/0043031 A1 | 3/2006 | Rinderer |
| 2006/0087792 A1 | 4/2006 | Ng et al. |
| 2006/0103270 A1 | 5/2006 | Bergesch et al. |
| 2006/0118321 A1 | 6/2006 | Herring et al. |
| 2006/0141921 A1 | 6/2006 | Turek et al. |
| 2006/0162948 A1 | 7/2006 | Rinderer et al. |
| 2006/0213853 A1 | 9/2006 | Schluter et al. |
| 2007/0064389 A1 | 3/2007 | Lewis, II et al. |
| 2007/0064391 A1 | 3/2007 | Lewis, II et al. |
| 2007/0081874 A1* | 4/2007 | Kamino et al. ............ 411/372.5 |
| 2007/0183129 A1 | 8/2007 | Lewis, II et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1* | 9/2007 | Adducci et al. ................ 174/50 |
| 2007/0293138 A1 | 12/2007 | Adducci et al. |
| 2008/0035810 A1 | 2/2008 | Lewis, II |
| 2008/0037228 A1 | 2/2008 | Lewis, II |
| 2008/0062654 A1 | 3/2008 | Mattlin et al. |
| 2008/0074849 A1 | 3/2008 | Adducci et al. |
| 2008/0130262 A1 | 6/2008 | Rinderer et al. |
| 2008/0174217 A1 | 7/2008 | Walker |
| 2008/0180004 A1 | 7/2008 | Martich et al. |
| 2008/0266789 A1 | 10/2008 | Hruby et al. |
| 2008/0289873 A1 | 11/2008 | Herring et al. |
| 2008/0316702 A1 | 12/2008 | Donowho et al. |
| 2008/0316703 A1 | 12/2008 | Donowho et al. |
| 2009/0014614 A1 | 1/2009 | Warmoth et al. |
| 2009/0059523 A1 | 3/2009 | Mallia et al. |
| 2009/0061755 A1 | 3/2009 | Calder et al. |
| 2009/0093169 A1 | 4/2009 | McGrath et al. |
| 2009/0129013 A1 | 5/2009 | Donowho et al. |
| 2009/0151983 A1 | 6/2009 | Sempliner et al. |
| 2009/0168306 A1 | 7/2009 | Sharp et al. |
| 2009/0190307 A1 | 7/2009 | Krietzman |
| 2009/0224110 A1 | 9/2009 | Donowho et al. |
| 2009/0227197 A1 | 9/2009 | Lewis, II et al. |
| 2009/0236117 A1 | 9/2009 | Garza et al. |
| 2009/0239460 A1 | 9/2009 | Lucia et al. |
| 2009/0239461 A1 | 9/2009 | Lewis, II et al. |
| 2009/0273915 A1 | 11/2009 | Dean, Jr. et al. |
| 2009/0283488 A1 | 11/2009 | McMillan, III et al. |
| 2010/0051308 A1 | 3/2010 | Hansen et al. |
| 2010/0061059 A1 | 3/2010 | Krietzman et al. |
| 2010/0084188 A1 | 4/2010 | Rajvanshi et al. |
| 2010/0096962 A1 | 4/2010 | Rajvanshi et al. |
| 2010/0101820 A1 | 4/2010 | Alaniz et al. |
| 2010/0122830 A1 | 5/2010 | Garza et al. |
| 2010/0126750 A1 | 5/2010 | Garza et al. |
| 2010/0126751 A1 | 5/2010 | Garza et al. |

(56) References Cited

U.S. PATENT DOCUMENTS

| | | |
|---|---|---|
| 2010/0172092 A1 | 7/2010 | Davis et al. |
| 2010/0172093 A1 | 7/2010 | Davis et al. |
| 2010/0193241 A1 | 8/2010 | Bennett et al. |
| 2010/0193754 A1 | 8/2010 | Garza et al. |
| 2010/0200707 A1 | 8/2010 | Garza et al. |
| 2010/0243315 A1 | 9/2010 | Shumate et al. |
| 2011/0001408 A1 | 1/2011 | Caveney et al. |
| 2011/0019362 A1 | 1/2011 | Krietzman |
| 2011/0056895 A1 | 3/2011 | Tichy |
| 2011/0083873 A1 | 4/2011 | Hartman et al. |
| 2011/0148261 A1 | 6/2011 | Donowho et al. |
| 2011/0211328 A1 | 9/2011 | Dean, Jr. et al. |
| 2011/0211329 A1 | 9/2011 | Dean, Jr. et al. |
| 2011/0278060 A1 | 11/2011 | Rajvanshi et al. |
| 2011/0287704 A1 | 11/2011 | Lewis, II et al. |
| 2011/0290553 A1 | 12/2011 | Behrens et al. |
| 2012/0013229 A1 | 1/2012 | Krietzman |
| 2012/0062083 A1 | 3/2012 | Lewis, II et al. |
| 2012/0062086 A1 | 3/2012 | Garza, Jr. et al. |
| 2012/0062091 A1 | 3/2012 | Donowho et al. |
| 2012/0063099 A1 | 3/2012 | Alaniz et al. |
| 2012/0112612 A1 | 5/2012 | Krietzman |
| 2012/0305307 A1 | 12/2012 | Korcz et al. |
| 2013/0160271 A1 | 6/2013 | Krietzman et al. |
| 2013/0165035 A1 | 6/2013 | Krietzman et al. |
| 2014/0132134 A1 | 5/2014 | Garza, Jr. et al. |

FOREIGN PATENT DOCUMENTS

| | | |
|---|---|---|
| DE | 19615759 A1 | 10/1997 |
| DE | 20207426 U1 | 9/2002 |
| EC | 000663943-0001 | 7/2007 |
| EC | 000663943-0002 | 7/2007 |
| EC | 000663943-0003 | 7/2007 |
| EC | 000663943-0004 | 7/2007 |
| EP | 0577433 | 1/1994 |
| EP | 2205054 A1 | 7/2010 |
| EP | 2429271 | 3/2012 |
| EP | 2429272 | 3/2012 |
| GB | 2366084 B | 9/2002 |
| GB | 2468823 B | 10/2012 |
| SE | 535066 C2 | 4/2012 |
| WO | 0101533 A1 | 1/2001 |
| WO | 2006055506 A2 | 5/2006 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009089307 A2 | 7/2009 |
| WO | 2009103090 A2 | 8/2009 |
| WO | 2009103090 A3 | 10/2009 |
| WO | 2009143193 A2 | 11/2009 |
| WO | 2009089307 A3 | 12/2009 |
| WO | 2009143193 A3 | 3/2010 |
| WO | 2010028384 A2 | 3/2010 |
| WO | 2010028384 A3 | 5/2010 |
| WO | 2010117699 A1 | 10/2010 |
| WO | 2011088430 A2 | 7/2011 |
| WO | 2011088438 A2 | 7/2011 |

OTHER PUBLICATIONS

Panduit Net-Access Vertical Exhaust System (VES) Specification Sheet, Panduit Corporation, dated Feb. 2011, 4 pages.

HP 10000 G2 42U Rack Air Duct Installation Guide, Hewlett-Packard Development Company, LP, dated Aug. 2008, 23 pages.

Chatsworth Products, Inc. "Cabinet Airflow Baffles—Air Dam Kit for CPI Cabinet Systems", Product Data Sheet, Jun. 2004, techsupport@chatsworth.com, 2 pages.

Information Disclosure Statement (IDS) Letter Regarding Common Patent Application(s), dated Jul. 10, 2013.

Information Disclosure Statement (IDS) Letter Regarding Common Patent Application(s), dated Apr. 29, 2013.

Information Disclosure Statement (IDS) Letter Regarding Common Patent Application(s), dated Oct. 18, 2013.

Information Disclosure Statement (IDS) Letter Regarding Common Patent Application(s), dated Jan. 27, 2014.

Information Disclosure Statement (IDS) Letter Regarding Common Patent Application(s), dated Jul. 23, 2014.

Information Disclosure Statement (IDS) Letter Regarding Common Patent Application(s), dated Apr. 22, 2014.

* cited by examiner

ELECTRONIC EQUIPMENT CABINET STRUCTURE

CROSS-REFERENCE TO RELATED APPLICATION

The present application is a U.S. non-provisional patent application of, and claims priority under 35 U.S.C. §119(e) to, U.S. provisional patent application Ser. No. 61/381,904, filed Sep. 10, 2010, which '904 application is incorporated by reference herein in its entirety. Additionally, each of the following U.S. patent applications, and any application publication thereof, is expressly incorporated by reference herein in its entirety:

(a) U.S. provisional patent application Ser. No. 61/381,905, filed Sep. 10, 2010, and entitled, "CABLE PASS-THROUGH PANEL FOR ELECTRONIC EQUIPMENT ENCLOSURE;"

(b) U.S. provisional patent application Ser. No. 61/381,909, filed Sep. 10, 2010, and entitled, "RAIL SEAL FOR ELECTRONIC EQUIPMENT ENCLOSURE;"

(c) U.S. provisional patent application Ser. No. 61/381,912, filed Sep. 10, 2010, and entitled, "RAIL MOUNTING CLAMP FOR ELECTRONIC EQUIPMENT ENCLOSURE;"

(d) U.S. provisional patent application Ser. No. 61/381,918, filed Sep. 10, 2010, and entitled, "VERTICAL MOUNTING RAIL WITH CABLE MANAGEMENT FEATURES;"

(e) U.S. non-provisional patent application Ser. No. 13/229,705, filed Sep. 10, 2011, published on Mar. 15, 2012 as US 2012/0062086 A1, and entitled, "CABLE PASS-THROUGH PANEL FOR ELECTRONIC EQUIPMENT ENCLOSURE;"

(f) U.S. non-provisional patent application Ser. No. 13/229,706, filed Sep. 10, 2011, published on Mar. 15, 2012 as US 2012/0063099 A1, and entitled, "RAIL SEAL FOR ELECTRONIC EQUIPMENT ENCLOSURE;"

(g) U.S. non-provisional patent application Ser. No. 13/229,707, filed Sep. 10, 2011, published on Mar. 15, 2012 as US 2012/0062083 A1, entitled, "RAIL MOUNTING CLAMP FOR ELECTRONIC EQUIPMENT ENCLOSURE," and issued on Jul. 22, 2014 as U.S. Pat. No. 8,787,023; and (h) U.S. non-provisional patent application Ser. No. 13/229,708, filed Sep. 10, 2011, published on Mar. 15, 2012 as US 2012/0062091 A1, and entitled, "VERTICAL MOUNTING RAIL WITH CABLE MANAGEMENT FEATURES."

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

1. Field of the Present Invention

The present invention relates generally to the field of racks, frames and cabinets for mounting and storing electronic components, and, more particularly, to reduced-complexity structures with high strength and capacity.

2. Background

Racks, frames and cabinets for mounting and storing electronic components have been well known for many years. Frames and racks are typically simple rectangular frameworks on which electronic components may be mounted, or on which other mounting members, such as shelves or brackets, may be mounted which in turn may support the electronic components. Cabinets are typically frames on which panels or doors, or both, are hung to provide aesthetic improvement, to protect the components from external influences, to provide security for the components stored inside, or for other reasons. Racks, frames and cabinets (sometimes collectively referred to hereinafter as "enclosures") have been built in many different sizes and with many different proportions in order to best accommodate the components which they are designed to store.

Various aspects of these structures have increased part counts and weight and created additional cost and manufacturing complications. In one example, it has been difficult to use casters on such structures without either decreasing strength and rigidity or significantly increasing manufacturing cost through additional steps and parts. In another example, side rails have typically been attached using either welded or bolt construction, with the former being more time-consuming and less convenient for shipping or disassembling, and the latter requiring fasteners to accurately locate the frame slides so as to maintain a standard equipment rail spacing (i.e., EIA 310D). When countersunk screws have been employed to locate and position these members, such frame geometries employed several brackets, welded to the door threshold; the accuracy of this method often requires significant post-processing to meet the standard rail spacing requirements. In still another example, in frame structures that are manufactured from two vertical posts with horizontal members connecting their upper and lower ends (common in both two- and four-post cabinets), welding is often used to fasten the various members together, but this manufacturing process normally requires the frame structure to be flipped over, often on a weld fixture, such that welding can be carried out from both sides.

Other problems with existing rack, frame and cabinet structures are also known. For example, electrical grounding throughout the structure is often a problem, as is thermal sealing of panels relative to the side rails. With regard to the latter, panels often interact with other panels or with frame members via butt joints, which are prone to air leaks.

For these and other reasons, a need exists for improved design and manufacturability in racks, frames and cabinets.

SUMMARY OF THE PRESENT INVENTION

The present invention comprises an electronic equipment cabinet structure. Broadly defined, the present invention according to a first aspect includes an electronic equipment cabinet structure that includes a frame having a plurality of vertical support posts and a plurality of cross members that connect the support posts together. At least one of the plurality of cross members includes a tab extending therefrom that is adapted to be plug welded to an end of one of the plurality of vertical support posts.

In features of this aspect, the tab may include at least two plug weld locations; the electronic equipment cabinet structure may further include at least one caster plate connected thereto; the caster plate may be adapted to be plug welded to one of the plurality of cross members; the caster plate may include a C-shaped portion to fittingly correspond with the cross member to which it is attached; and the caster plate may include a plurality of positioning tabs for alignment of the caster plate.

In further features of this aspect, the electronic equipment cabinet structure may further include at least one saddle bracket having a base and two sides extending in the same direction away from the base, wherein edges of the two sides are welded to one of the cross members and the base is mounted to the vertical support post with a fastener; each of the sides of the saddle bracket may include at least one cutout for lengthening the edges welded to the cross member; the base of the saddle bracket may include a countersunk aperture for receiving the fastener; the fastener may be a screw with nibs thereon to provide an electrical connection between the saddle bracket and the vertical support post to which it is attached; and the saddle bracket may include at least one pocket structure formed in one of the sides thereof.

In another feature of this aspect, the electronic equipment cabinet structure may further include a ground wire fastened and electrically connected to the frame with a self-tapping screw and a star washer.

Broadly defined, the present invention according to a second aspect includes an electronic equipment cabinet structure substantially as shown and described.

Broadly defined, the present invention according to a third aspect includes a method of manufacturing an electronic equipment cabinet structure substantially as shown and described.

Broadly defined, the present invention according to a fourth aspect includes an electronic equipment cabinet having a sealing geometry between a side panel and a side cross member as shown and described.

Broadly defined, the present invention according to a fifth aspect includes an electronic equipment cabinet having a sealing geometry between a side panel and a vertical support post as shown and described.

Broadly defined, the present invention according to a sixth aspect includes an electronic equipment cabinet structure that includes a frame having a plurality of vertical support posts and a plurality of cross members that connect the support posts together. The cabinet structure further includes at least one caster plate connected to one of the plurality of cross members. The caster plate includes a C-shaped portion to fittingly correspond with the cross member to which it is connected, thereby providing rigidity to the frame.

In features of this aspect, the caster plate may be plug welded to the cross member to which it is connected; and the caster plate may be plug welded to the cross member at a plurality of plug weld locations.

In further features of this aspect, the caster plate may provide a mounting shelf for accessories connected to the frame; and the caster plate may be adapted to support, at the mounting shelf, an accessory mounted to a front of the frame.

In further features of this aspect, the caster plate may include a plurality of positioning tabs for alignment; the cross member to which the caster plate may be connected is located at a front of the frame; and the cross member to which the caster plate may be connected is located at a rear of the frame.

In further features of this aspect, at least one of the plurality of cross members may include a tab extending therefrom that is connected to an end of one of the plurality of vertical support posts; the tab may be plug welded, from one side of the frame, to the end of the selected one of the plurality of vertical support posts; the tab may be plug welded to the end of the selected one of the plurality of vertical support posts at a plurality of plug weld locations; the tab may be connected to the end of the selected one of the plurality of vertical support posts with separate fasteners; and the tab may be riveted to the end of the selected one of the plurality of vertical support posts.

In still further features of this aspect, the electronic equipment cabinet structure may further includes a ground wire fastened and electrically connected to the frame with a fastener and a tooth-based washer; and the fastener may be a self-tapping screw.

Broadly defined, the present invention according to a seventh aspect includes an electronic equipment cabinet structure that includes a frame having a plurality of vertical support posts and a plurality of cross members that connect the support posts together. The cabinet structure further includes at least one bracket having a base and two sides extending in the same direction away from the base. The edges of the two sides are connected to one of the cross members and the base being connected to one of the vertical support posts.

In features of this aspect, the edges of the two sides may be welded to the cross member to which the bracket is connected; the bracket may include at least one pocket structure formed in one of the sides thereof; and each of the sides of the bracket may include at least one cutout for lengthening the edges welded to the cross member.

In other features of this aspect, the electronic equipment cabinet structure may further include a ground wire fastened and electrically connected to the frame with a fastener and a tooth-based washer; and the fastener may be a self-tapping screw.

Broadly defined, the present invention according to an eighth aspect includes an electronic equipment cabinet structure that includes a frame having a plurality of vertical support posts and a plurality of cross members that connect the support posts together. The cabinet structure further includes at least one bracket connected to one of the vertical support posts. The bracket includes a first embossed portion nested within a corresponding second embossed portion on the vertical support post to which the bracket is connected.

In features of this aspect, the first embossed portion and the second embossed portion may each be made from a sheet metal; the first embossed portion may be nested flush against the second embossed portion, thereby imparting rigidity to the frame; the first embossed portion may include a countersunk aperture capable of receiving a fastener; the countersunk aperture may accommodate a fastener to retain the first embossed portion flush against the second embossed portion; the fastener may be a countersunk screw; the countersunk screw may include protrusions thereon to provide an electrical connection between the bracket and the vertical support post to which it is connected; the fastener may be undercut to reduce penetration depth thereof.

In other features of this aspect, each of the first and second embossed portions may have a non-circular cross-sectional shape so as to prevent rotation of one of the first and second embossed portions relative to the other; and the non-circular cross-sectional shape may be selected from a star shape, a triangular shape, a flower shape, a hexagonal shape, and a rectangular shape.

In still other features of this aspect, the electronic equipment cabinet structure may further include a ground wire fastened and electrically connected to the frame with a fastener and a tooth-based washer; and the fastener may be a self-tapping screw.

Broadly defined, the present invention according to a ninth aspect includes an electronic equipment cabinet structure that includes a frame having a plurality of vertical support posts and a plurality of cross members that connect the support posts together. The cabinet structure further includes one or more panels having an edge geometry that fittingly corresponds with an inset portion of one of the cross members.

In features of this aspect, the edge geometry may include an S-shape; and the one or more panels may be adapted to include a compliant seal at the edge geometry.

In further features of this aspect, the selected one of the plurality of cross members may be a middle cross member with inset portions at each side; and one of the one or more panels may fittingly correspond with each inset portion.

In still further features of this aspect, the electronic equipment cabinet structure may further include a ground wire fastened and electrically connected to the frame with a fastener and a tooth-based washer; and the fastener may be a self-tapping screw.

Broadly defined, the present invention according to a tenth aspect includes a method of assembling an electronic equipment cabinet structure. The method includes the steps of providing a plurality of vertical support posts and a plurality of cross members, at least one of the plurality of cross members having a tab extending therefrom, and welding the tab to an end of a selected one of the plurality of vertical support posts, thereby attaching the at least one cross member to the selected vertical support post to form a portion of a frame of an electronic equipment cabinet structure. The welding step occurs at one side of the frame being formed.

In features of this aspect, the welding step may include plug welding the tab to the end of the selected one of the plurality of vertical support posts; the welding step may include plug welding at a plurality of plug weld locations; the frame being formed may be a front frame; and the frame being formed may be a rear frame.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
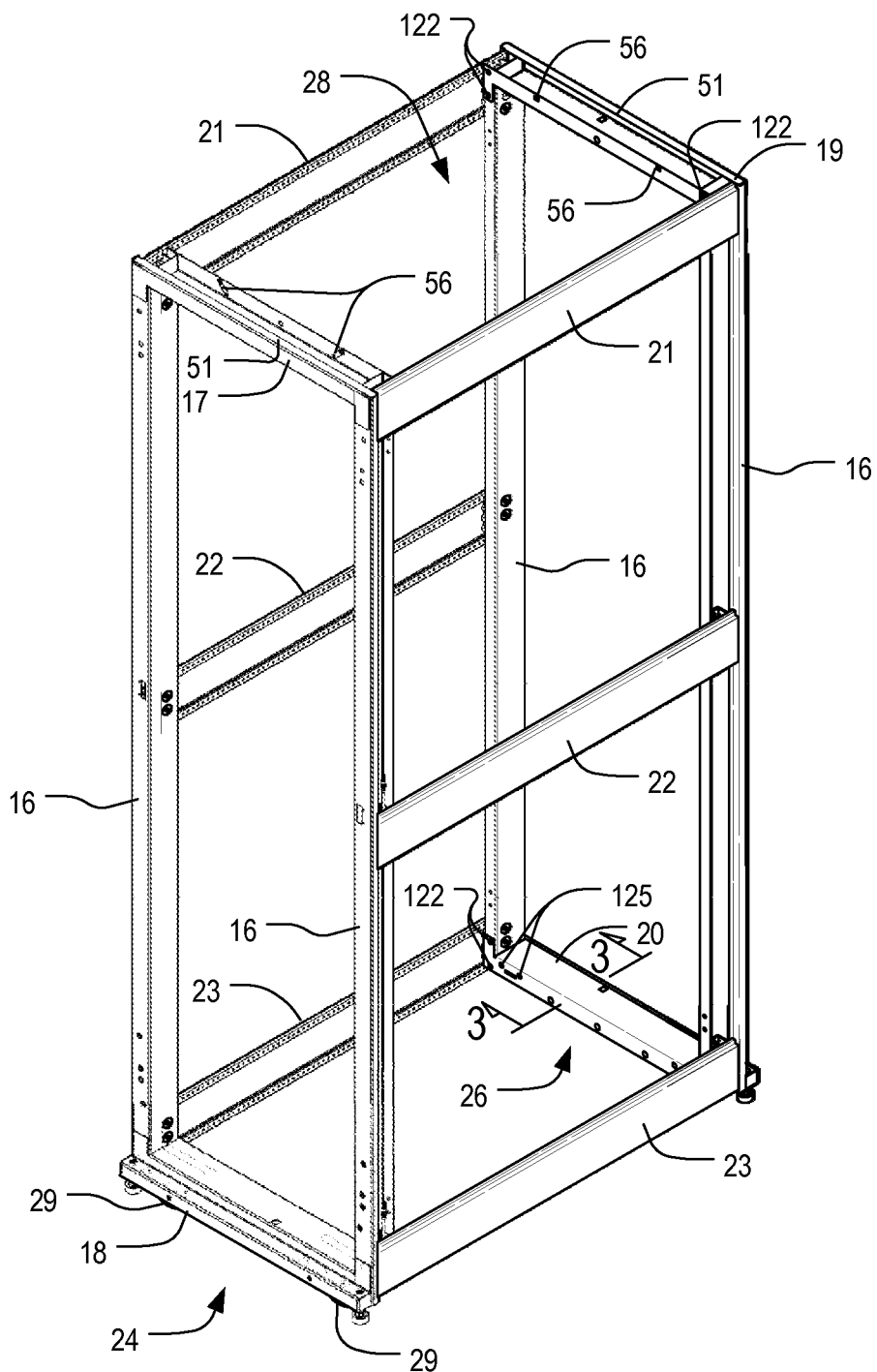
FIG. 1 is a front isometric view of an electronic equipment enclosure frame structure in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Regarding applicability of 35 U.S.C. §112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiments is merely exemplary in nature and is in no way intended to limit the invention, its implementations, or uses.

FIG. 1 is a front isometric view of an electronic equipment enclosure frame structure 12 in accordance with one or more preferred embodiments of the present invention. As shown therein, the frame structure 12 includes four vertical support posts 16, upper and lower front cross members 17,18, upper and lower rear cross members 19,20 and three pairs of side cross members 21,22,23. Each vertical support post 16 includes a plurality of cross member attachment apertures at each end. Two of the vertical support posts 16 are connected together at their upper and lower ends by the upper and lower front cross members 17,18, respectively, and the other two support posts 16 are connected together at their upper and lower ends by the upper and lower rear cross members 19,20, respectively. The front cross members 17,18 and their respective support posts 16 thus define a front frame (sometimes referred to as a door threshold frame) 24, and the rear cross members 19,20 and their respective support posts 16 define a rear door threshold frame 26. The front and rear frames 24,26 may then be connected together at their respective corners by the upper, middle and lower side cross members 21,22,23.

Figure 2:
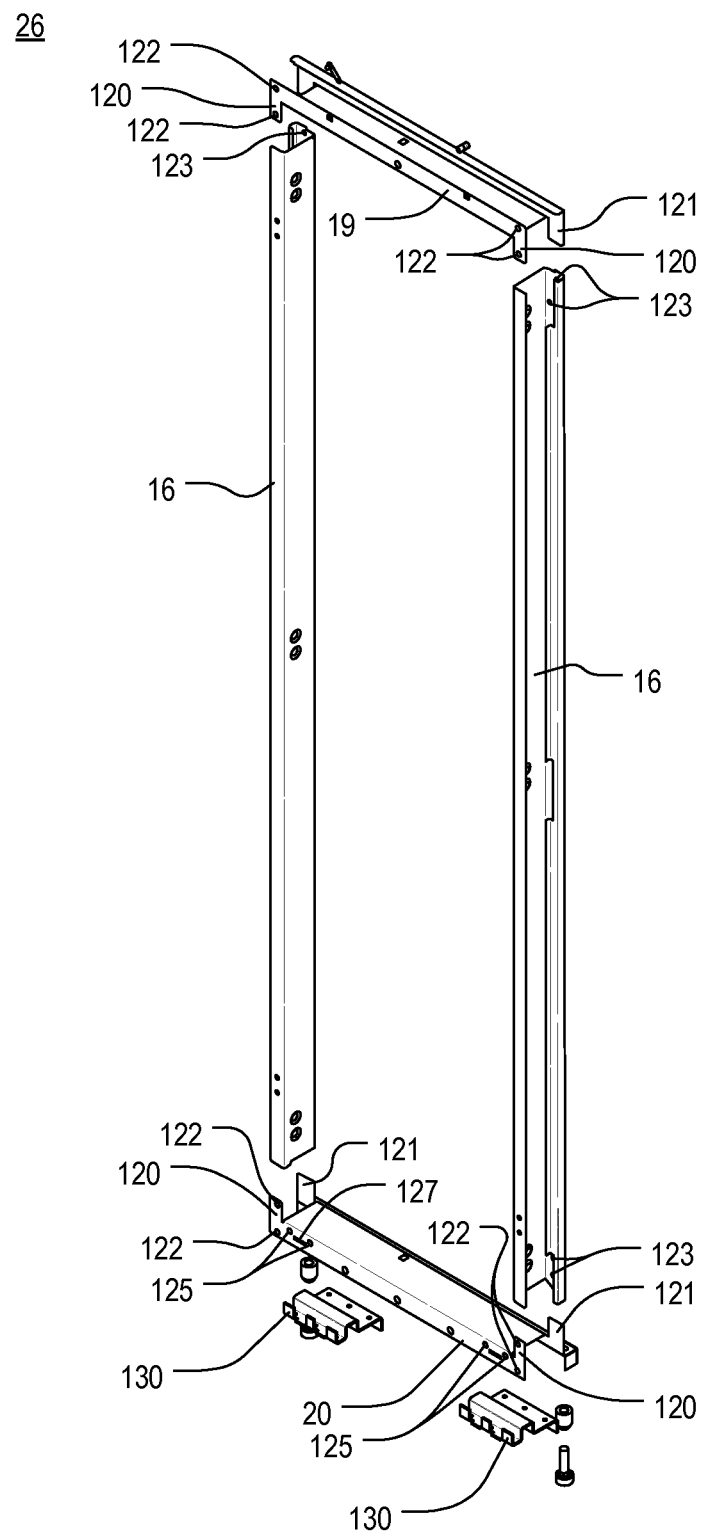
FIG. 2 is an exploded isometric view of the rear frame of the enclosure frame structure of FIG. 1.

FIG. 2 is an exploded isometric view of the rear frame 26 of the enclosure frame structure 12 of FIG. 1. With reference to FIGS. 1 and 2, each upper and lower cross member 17,19 and 18,20 includes a plurality of tabs or gussets 120,121, adapted to interact with a respective end of a vertical support post 16, extending therefrom. It will be appreciated that although common designators are utilized, the tabs 120,121 on the upper cross members 17,19 may comprise a different geometry than the tabs 120,121 on the lower cross members 18,20. The upper and lower cross members 19,20 (as well as the upper and lower front cross members 17,18) are preferably plug welded to the vertical support posts 16 at a plurality of locations 122. Preferably, two plug weld locations 122 are provided in the tabs 120 on a first side of the cross members 19,20, and two more plug weld locations 123 are provided at each end of each vertical support post 16 for use with the tabs 121 on the other side. The welded tab construction provides significant frame stiffness, and the illustrated arrangement of plug weld locations 122,123 makes it possible to conduct all welding, during assembly, from one side of the frame 26. Alternatively, in other contemplated embodiments, the tabs 120 may be connected to respective ends of a vertical support post 16 with separate fasteners or by other types of welds. Furthermore, it is contemplated that the tabs 120 may be riveted to respective ends of a vertical support post 16.

Figure 3:
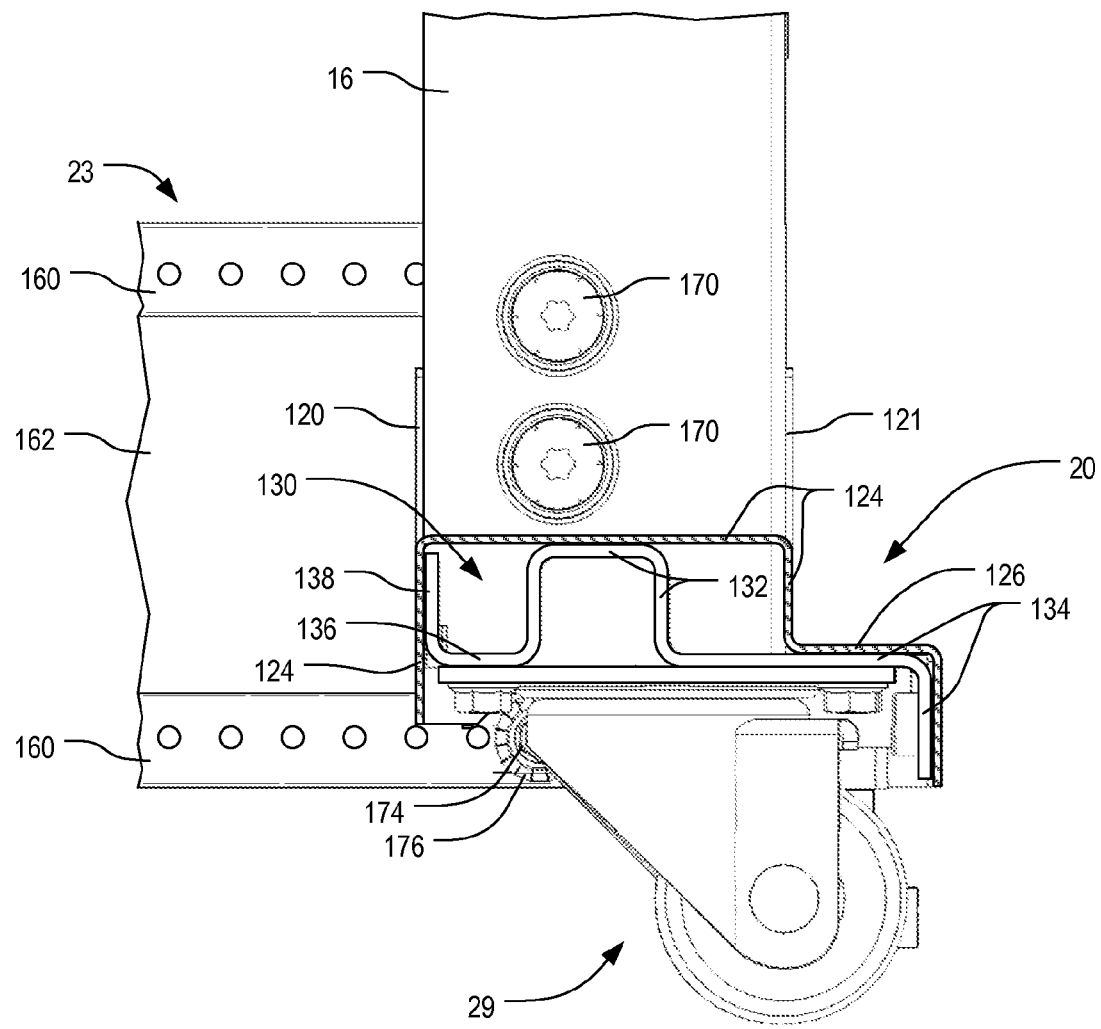
FIG. 3 is an enlarged fragmentary side cross-sectional view of the lower left corner of the rear of the enclosure frame of FIG. 1, taken along line 3-3.
Figure 4A:
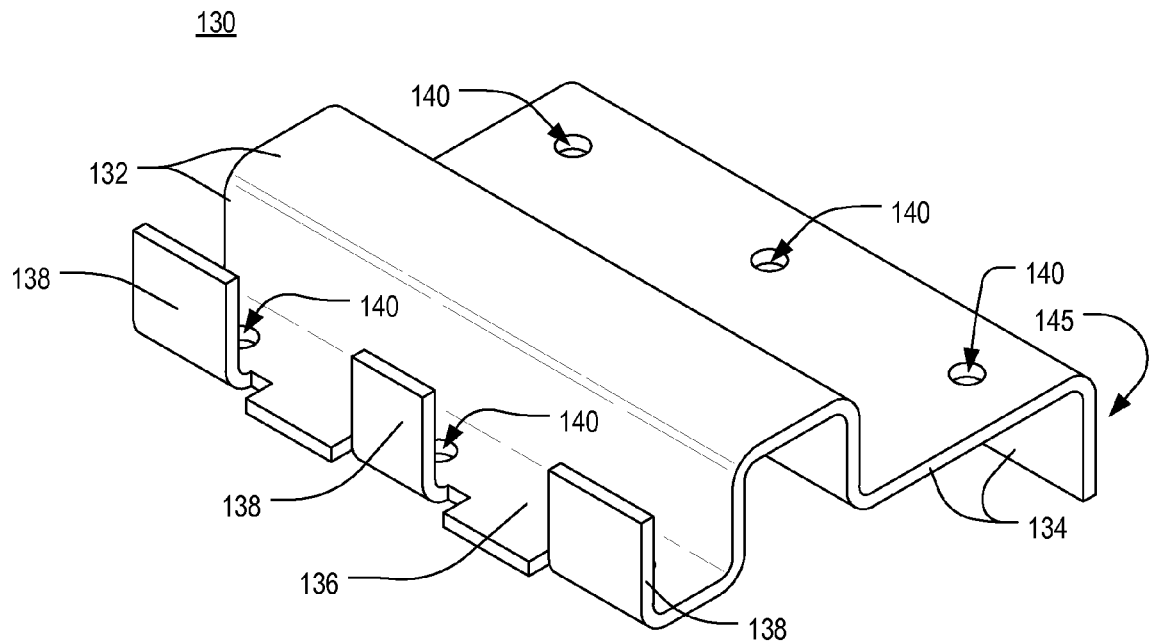
FIG. 4A is an enlarged top isometric view of the caster plate of FIG. 3.
Figure 4B:
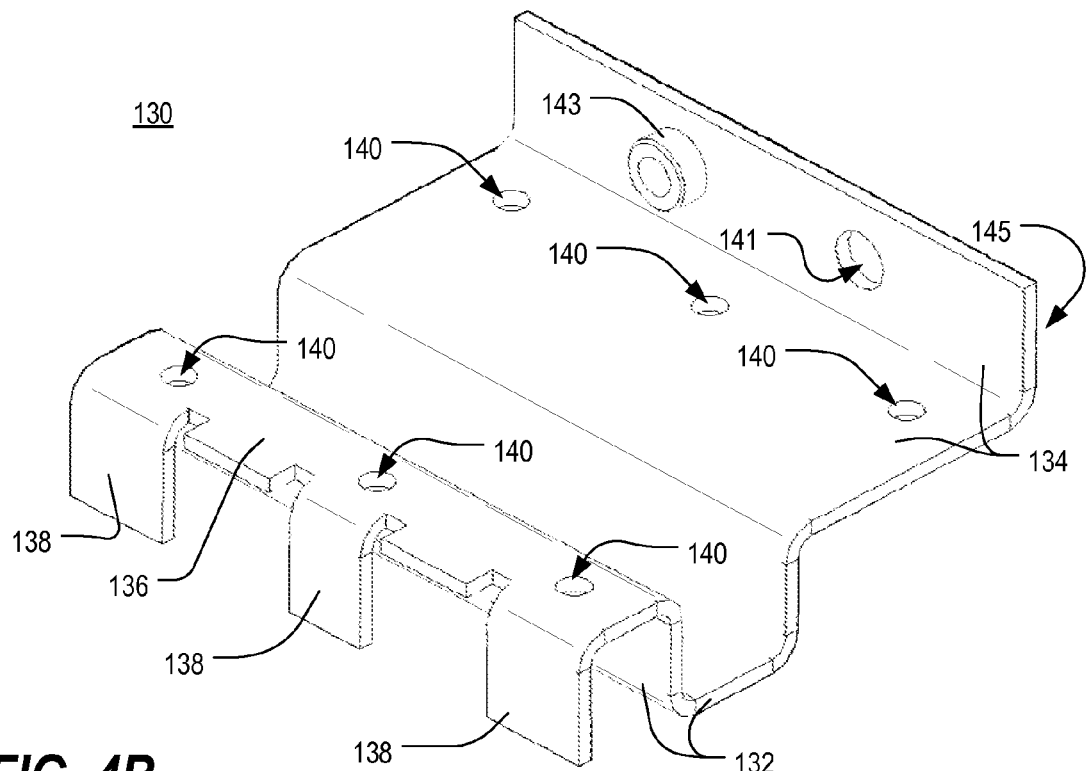
FIG. 4B is an enlarged bottom isometric view of the caster plate of FIG. 3.

Each of the front and rear frames 24,26 includes a pair of caster plates 130 connected to the bottom thereof. FIG. 3 is an enlarged fragmentary side cross-sectional view of the lower left corner of the rear of the enclosure frame 12 of FIG. 1, taken along line 3-3. FIG. 4A is an enlarged isometric view of the caster plate 130 of FIG. 3, and FIG. 4B is an enlarged bottom isometric view of the caster plate 130 of FIG. 3. As perhaps best shown in FIG. 3, the lower cross member 20, when considered in cross-section, includes a first portion 124 and a second portion 126. The first portion 124 has a downwardly-opening C-shaped cross-section and extends between the vertical support posts 16, and the second portion 126 has a cross-section in the form of a shelf, extending from the outside of the first portion 124, and a skirt depending therefrom. Likewise, the caster plate 130, when considered in cross-section, also includes a plurality of portions 132,134, 136. A first portion 132 has a downwardly-opening C-shaped cross-section but is not as wide as the first portion 124 of the cross member 20, and a second portion 134 has a cross-section in the form of a shelf, extending from the outside of the first portion 132, and a skirt depending therefrom. As perhaps best shown in FIGS. 4A and 4B, the caster plate 130 also includes a third portion 136 having a cross-section in the form of a shelf extending from the inside of the first portion 132 and one or more tabs 138 extending upward from the distal end thereof. Apertures 140 are included in the inner and outer shelves for conventional connection of casters 29 (barely visible in FIG. 1) thereto. Additionally, as perhaps best seen in FIG. 4B, the second portion 134, which is generally in the shape of a shelf, includes apertures 141 for accommodating fasteners 143, which may include threaded screws and nuts, welded nuts, and the like. In this regard, the second portion 134 provides a mounting shelf 145 for supporting accessories to be mounted at the front or rear frames 24,26.

Each caster plate 130 is preferably welded to a respective end of a lower cross member 20; preferably, two plug welds 125 are provided for this purpose along the cross member 20 adjacent the welds 122 on the first-side tabs 120. Although not specifically illustrated, similar caster plates 130 are welded to the ends of the lower front cross member 18 as well. Bridge lances 127 (one of which is identified in FIG. 2) protrude inward from the sides of the lower cross members 20 for receipt between adjacent tabs 138 on the respective caster plates 130, providing a positioning support for the caster plates 130 prior to welding. By creating separate interactions, various ones of which may be in the form of welds, between the caster plate tabs 138 and the inner surface of one side of the C-shaped portion 124 of the cross member 20, between the top of the caster plate first portion 132 and the lower surface of the top of the C-shaped portion 134 of the cross member, between the top of the outer shelf 134 of the caster plate 130 and the lower surface of the shelf 126 of the cross member 20, and between the skirt of the caster plate 130 and the skirt of the cross member 20, considerable rigidity and a large mass moment of inertia are provided. Furthermore, the end of the C-shaped first portion 132 of the caster plate 130 and the end of one of the tabs 138 of the caster plate 130 may be welded directly to the lower end of the vertical support post 16, thereby strengthening lateral rigidity.

Although the particular frame structure 12 described and illustrated herein includes various novel aspects, it will be apparent to the Ordinary Artisan that some aspects of the present invention are likewise applicable to frame structures having one or more elements of generally conventional design and construction. Furthermore, in at least a few embodiments, other connection means may be used to join the various members together. In this regard, other examples of conventional connection means are described in commonly-assigned U.S. Pat. No. 6,185,098, U.S. Pat. No. 7,119,282, U.S. Pat. No. 7,697,285, U.S. Patent Application Publication No. U.S. 2009/0190307 A1, U.S. Patent Application Publication No. U.S. 2009/0227197 A1, U.S. Patent Application Publication No. U.S. 2009/0283488 A1, and U.S. Patent Application Publication No. U.S. 2010/0172092 A1, the entirety of each of which is incorporated herein by reference. Although likewise not illustrated herein, the precision and the stability of each of the corners of at least some types of four post frame structures may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

Figure 5A:
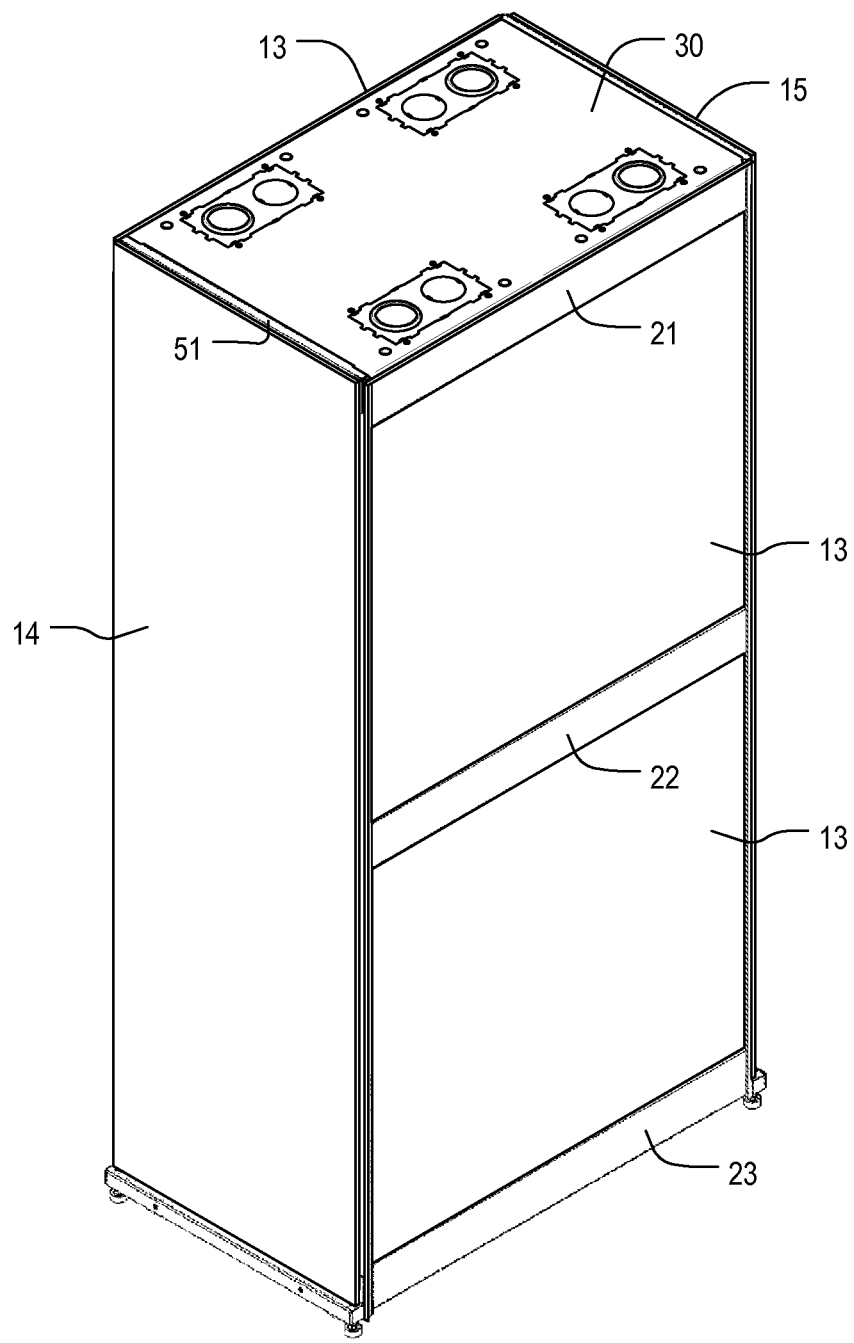
FIG. 5A is an isometric view of the frame structure of FIG. 1, shown with panels installed thereon.

The frame structure 12 may be enclosed by one or more panels to form an electronic equipment enclosure 10. FIG. 5A is an isometric view of the frame structure 12 of FIG. 1, shown with panels installed thereon. As shown therein, the enclosure 10 may include right and/or left panels 13, a front panel 14, and a rear panel 15, one or more of which may be configured to operate as a door to the interior of the enclosure 10 (not illustrated). Various different connection means may be used to join the various panels 13,14,15 to the frame structure 12. One or more novel connection means may be described and/or illustrated herein. However, although not illustrated herein, it will be apparent to the Ordinary Artisan that in at least some embodiments, any of a variety of other connection means may be used instead to join the panels to the frame structure 12.

Figure 5B:
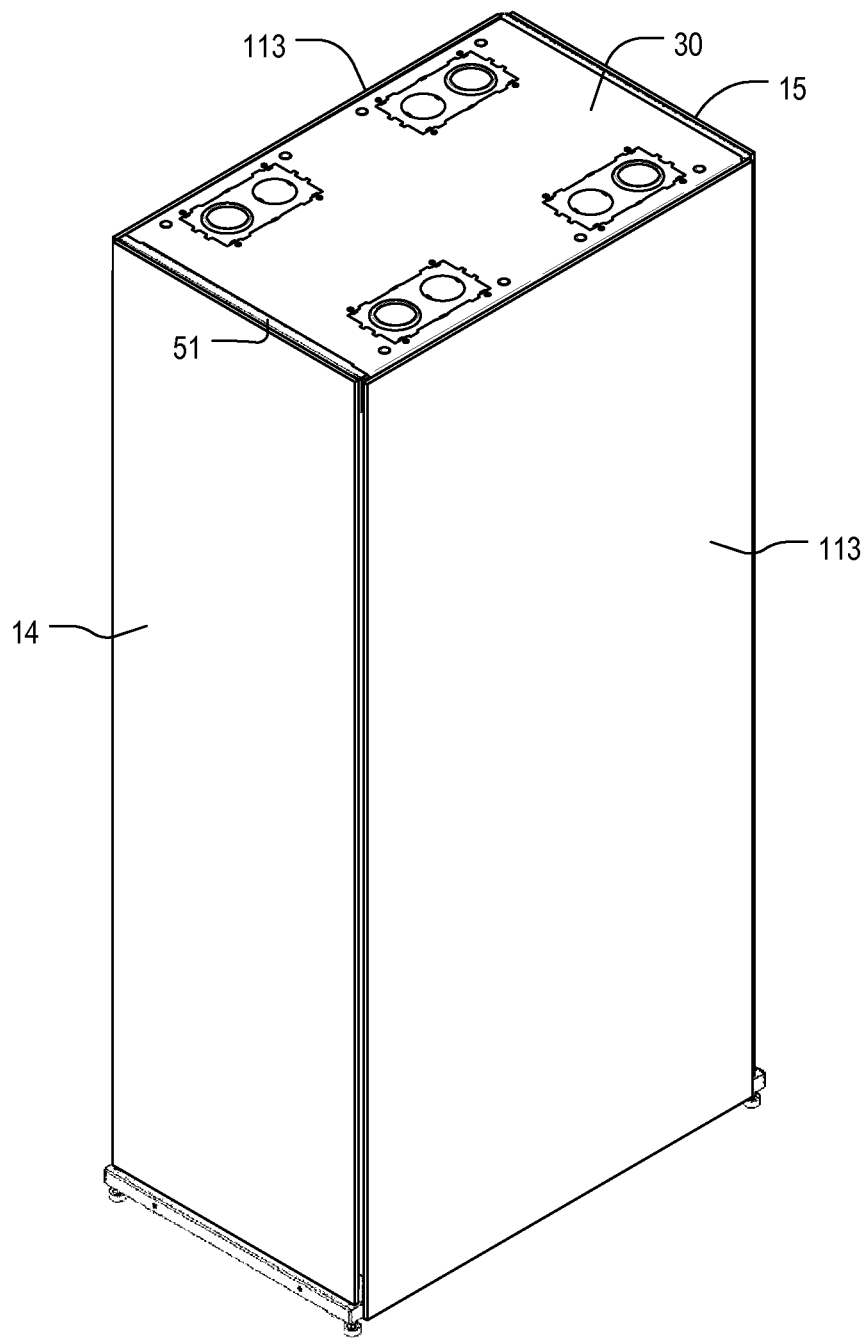
FIG. 5B is an isometric view of another frame structure, similar to that of FIG. 5A, shown with alternative panels installed thereon.

FIG. 5B is an isometric view of another frame structure 110, similar to that of FIG. 5A, shown with an alternative panel 113 installed thereon. Alternative panels 113 may be suitable in connection with one or more aspects of the present invention.

The enclosure further includes a generally flat top panel 30 sized and shaped to fit an opening 28 defined by the four vertical support posts 16 in connection with the upper front cross member 17, the upper rear cross member 19, and the upper side cross members 21. When installed, the top panel 30 covers the opening 28. In a contemplated embodiment, the top panel 30 is manufactured from sheet metal or other metal-based material. The top panel 30 may include features such as those described in a co-pending, commonly-assigned non-provisional patent application Ser. No. 13/229,705, entitled, "CABLE PASS-THROUGH PANEL FOR ELECTRONIC EQUIPMENT ENCLOSURE" (the "'705 Application").

Figure 6:
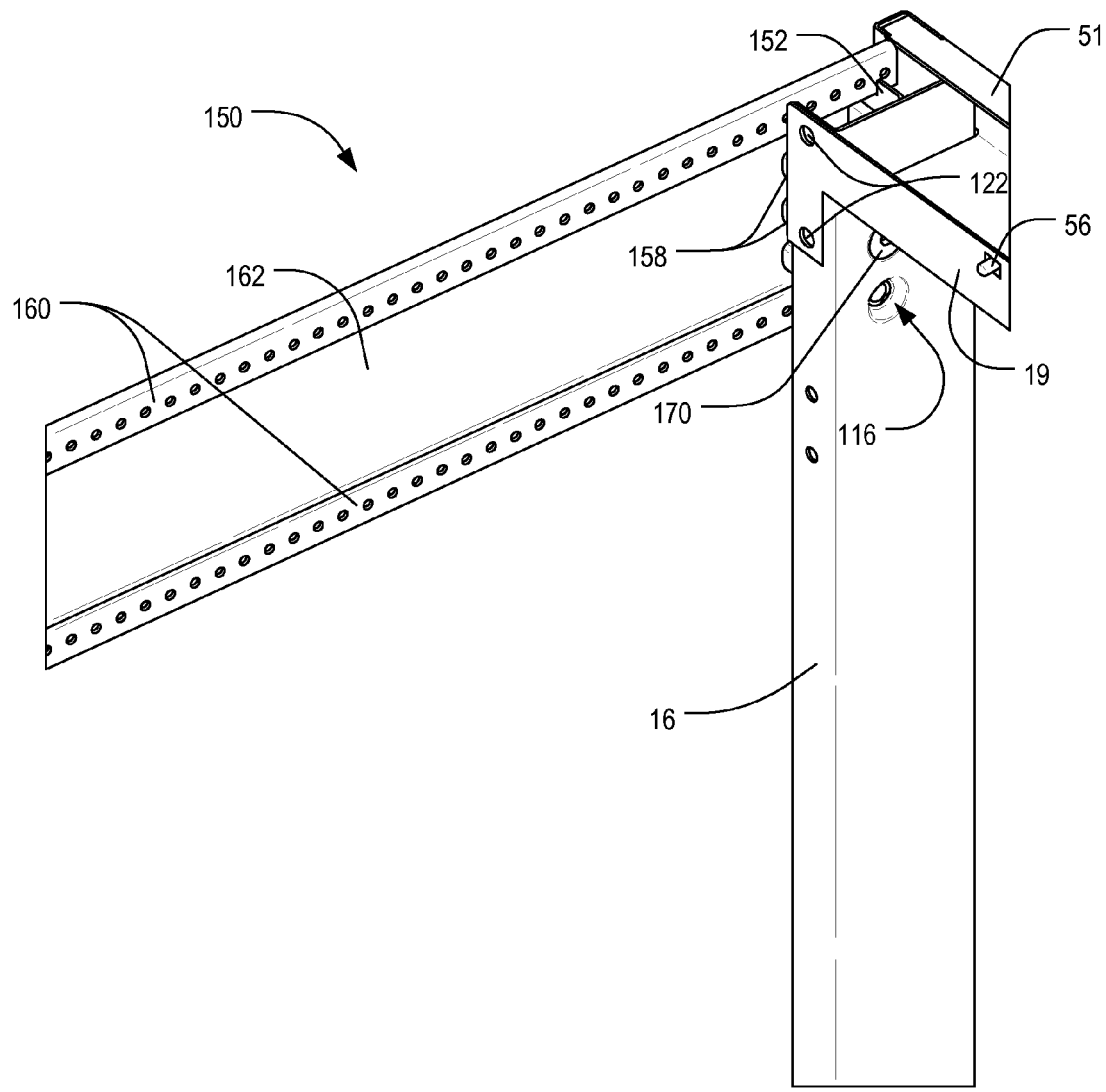
FIG. 6 is an enlarged orthogonal view of the upper left corner of the rear of the enclosure frame of FIG. 1.

FIG. 6 is an enlarged orthogonal view of the upper left corner of the rear of the enclosure frame of FIG. 1. In a contemplated embodiment, the upper front and rear cross members 17,19 each include two spring pins 56 and a retaining flange 51 as seen, for example, in FIGS. 1 and 6. As described in the '705 Application, the spring pins 56 and end flanges 51 may be utilized to facilitate reversible, tool-free installation of the top panel 30.

Figure 7:
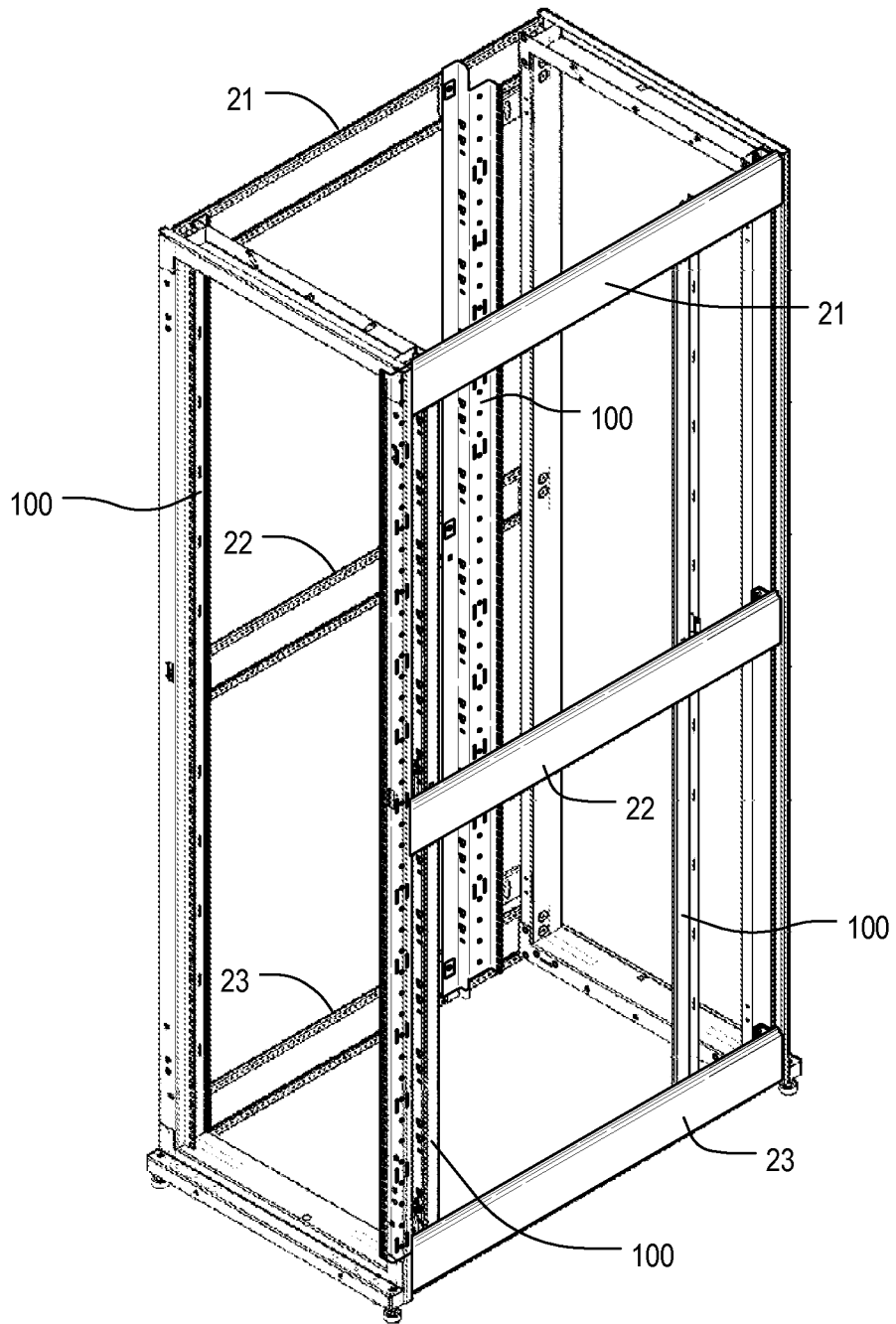
FIG. 7 is a front isometric view of the enclosure frame of FIG. 1, shown with a plurality of vertical mounting rails installed therein.

FIG. 7 is a front isometric view of the enclosure frame of FIG. 1, shown with a plurality of vertical mounting rails 100 installed therein. As shown therein, the vertical mounting rails 100 may be connected to the side cross members 21,22,23. One preferred method and structure for such connection is described and illustrated in a co-pending, commonly-assigned non-provisional patent application Ser. No. 13/229,707, entitled, "RAIL MOUNTING CLAMP FOR ELECTRONIC EQUIPMENT ENCLOSURE."

Figure 8:
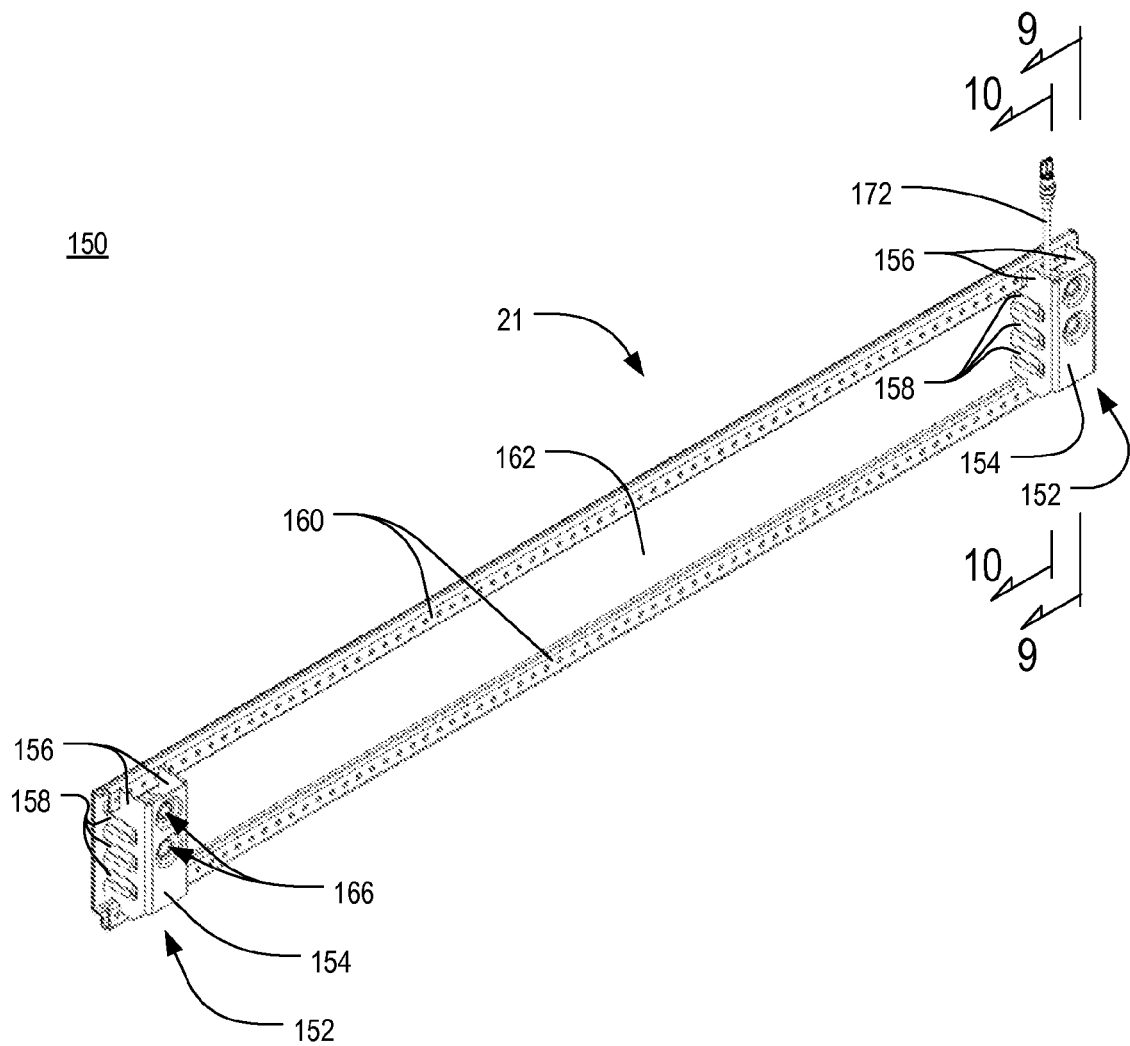
FIG. 8 is an isometric view of a side rail assembly, formed from one of the side cross members of the enclosure frame of FIG. 1 and two saddle brackets.

FIG. 8 is an isometric view of a side rail assembly 150, formed from one of the side cross members 21,22,23 of the enclosure frame of FIG. 1 and two saddle brackets 152. The saddle brackets 152 are welded to the cross member 21,22,23 and the entire assembly 150 may then be connected to the vertical support posts 16 via fasteners 170 as further described hereinbelow. Pocket structures 158 formed in the sides 156 of the saddle brackets 152, as seen in FIGS. 6 and 8, help stiffen the part and locate the welds.

Figure 9:
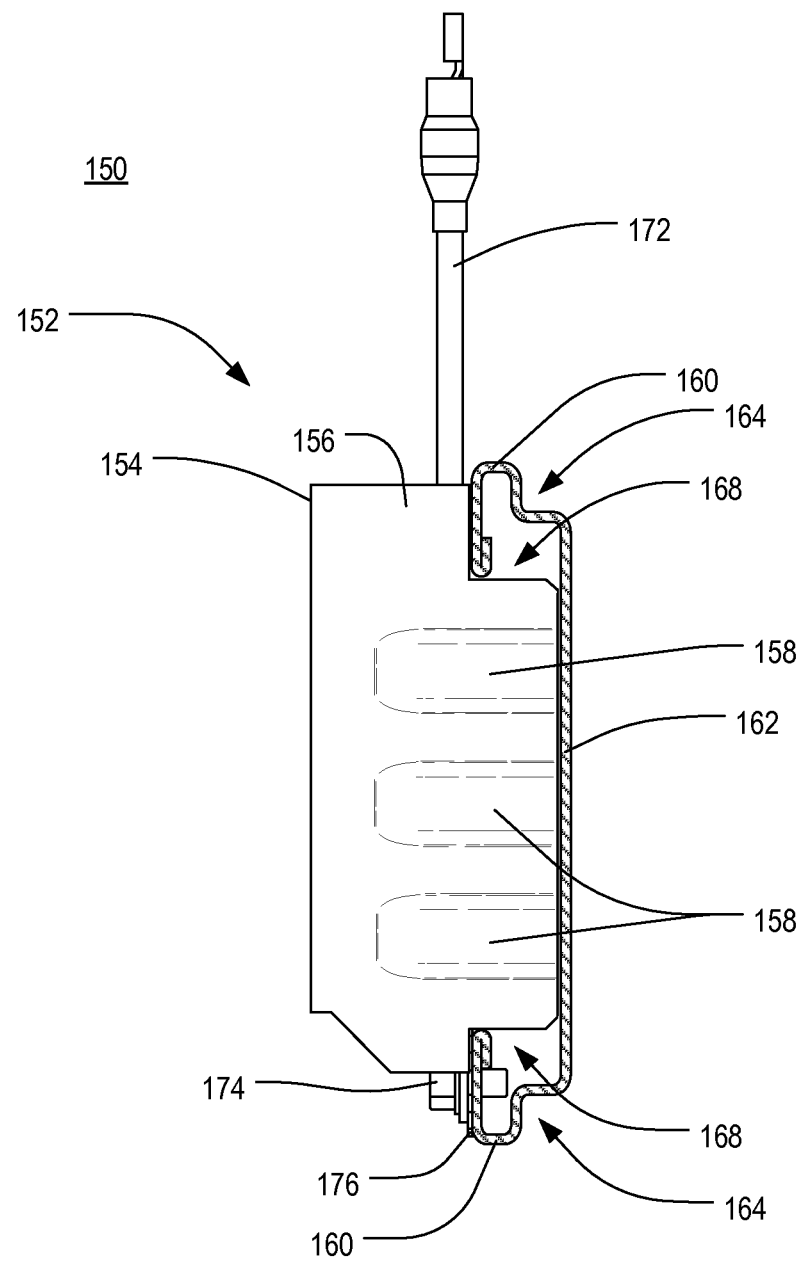
FIG. 9 is a rear cross-sectional view of the side rail assembly of FIG. 8, taken along line 9-9.
Figure 10:
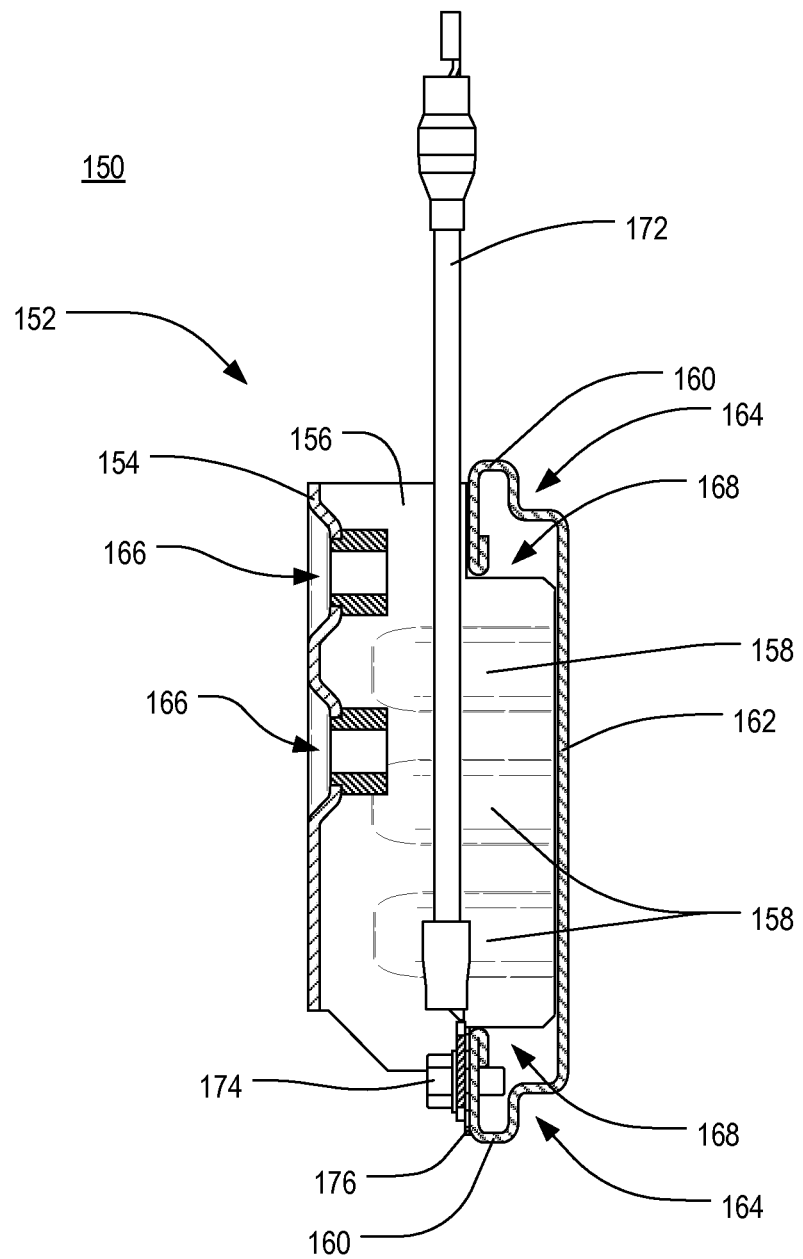
FIG. 10 is a rear cross-sectional view of the side rail assembly of FIG. 8, taken along line 10-10.
Figure 11:
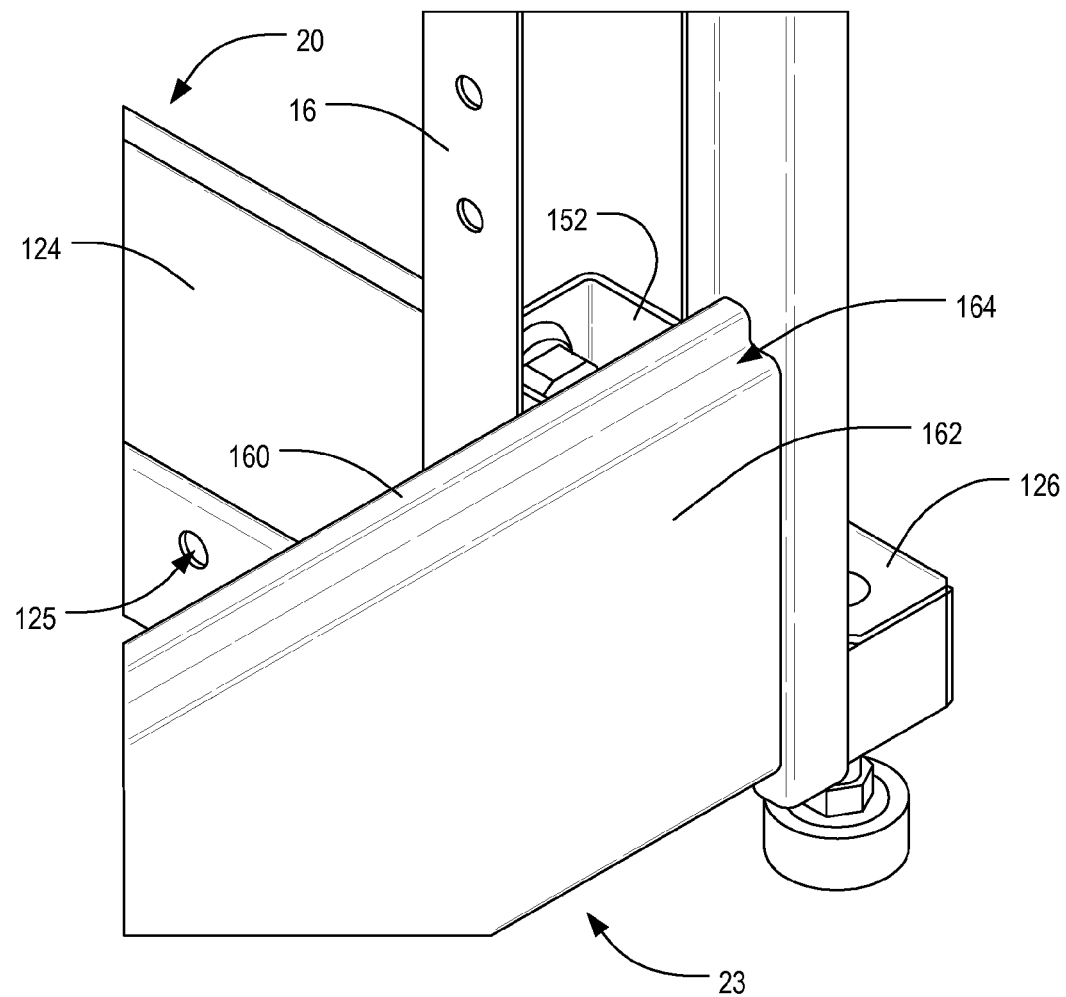
FIG. 11 is an enlarged fragmentary isometric view of the lower right corner of the rear of the enclosure frame of FIG. 1.

FIG. 9 is a rear cross-sectional view of the side rail assembly 150 of FIG. 8, taken along line 9-9, and FIG. 10 is a rear cross-sectional view of the side rail assembly 150 of FIG. 8, taken along line 10-10. As shown therein, the cross member 21,21,23, when considered in cross-section, includes upper and lower channels 160 extending from a central web 162. A row of apertures, preferably evenly-spaced, is provided along each channel such that the apertures are aligned with those in the other channel and those on the cross member 21,22,23 directly across therefrom. Each channel 160 includes an inset portion 164 whose outer surface helps allow for improved thermal sealing as described hereinbelow. The inset 164 is perhaps best shown in FIG. 11, which is an enlarged fragmentary isometric view of the lower right corner of the rear of the enclosure frame 12 of FIG. 1. The distal edge of each channel 160 doubles over on itself, thereby providing additional strength to the cross member 21,22,23. Each saddle bracket 152 includes a base 154 and two sides 156. As visible in FIGS. 9 and 10, the sides 156 include cutouts 168 such that respective surfaces thereof interact with both the outside of the upper and lower channels 160 and the inside of the central web 160, thereby permitting additional welding to be applied thereto.

Although not illustrated, it will be appreciated that in an alternative embodiment, the side cross members 21,22,23 could be manufactured as an aluminum extrusion with "T"-slots.

Figure 12:
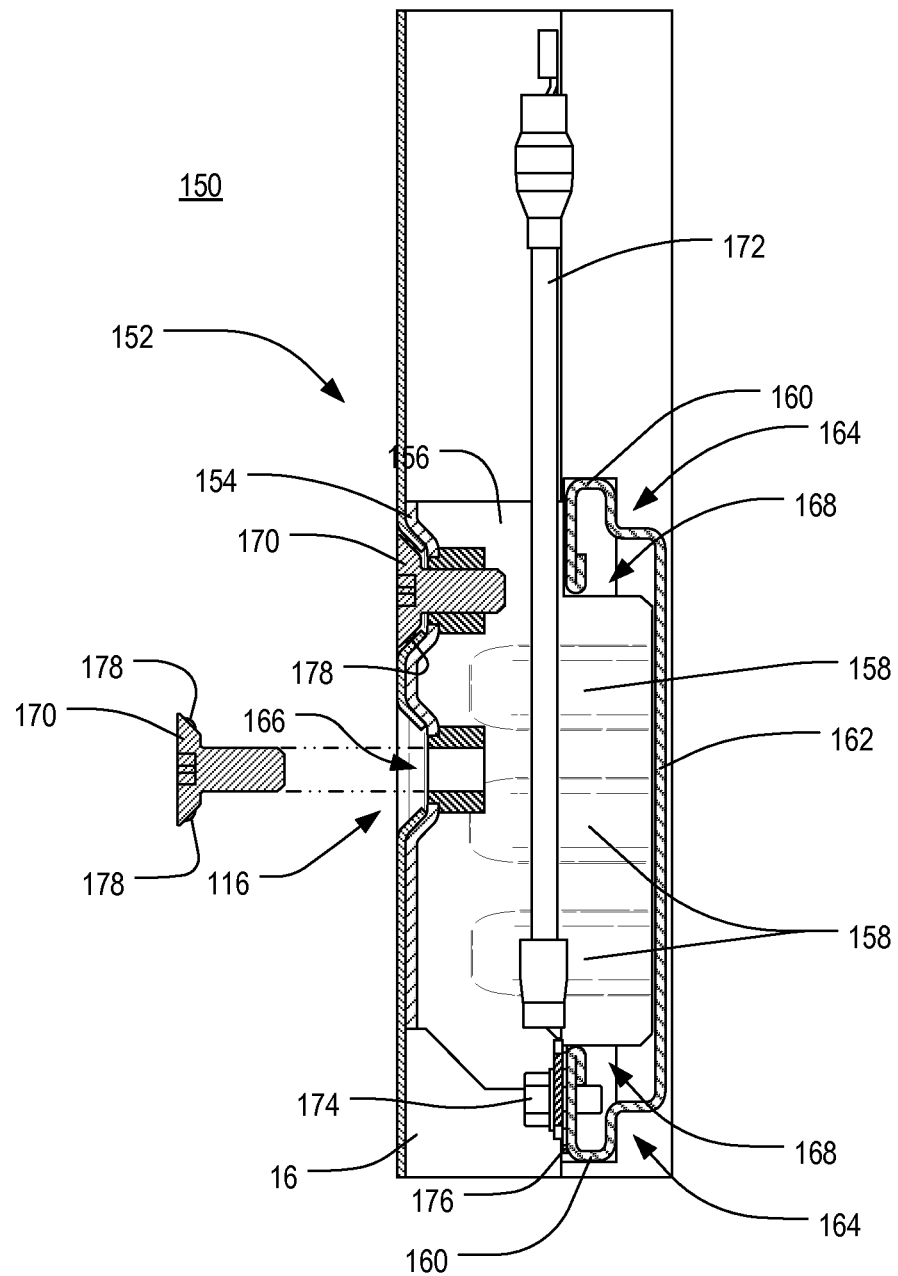
FIG. 12 is a rear fragmentary cross-sectional view of the side rail assembly of FIG. 10 shown installed on the enclosure frame.

FIG. 12 is a rear fragmentary cross-sectional view of the side rail assembly 150 of FIG. 10 shown installed on the enclosure frame 12. With particular reference to FIGS. 6, 10 and 12, the saddle brackets 152 and the vertical support posts 16 include corresponding countersunk apertures 116,166, in the form of embossed portions, which align with each other for convenient positioning of the saddle brackets 152 against the support posts 16. Once positioned, the structures may be connected together via fasteners 170, such as a countersunk screw. By accurately locating these apertures 116, the side cross members 21,22,23 are in turn accurately located and positioned during assembly. Furthermore, the design minimizes welds required to attach the side cross members 21,22, 23 as no additional brackets are required on the door threshold frames 24,26. As perhaps best seen in FIG. 12, the fasteners 170 may be undercut, or cut short, to reduce penetration depth and accommodate a shallower recess depth.

When fastened, the countersunk apertures 116,166 are nested flush against one another, thereby imparting further rigidity to the frame 12 and providing load bearing support. Saddle brackets 152 and vertical support posts 16 with countersunk apertures 116,166 may be formed, at least in part, from a relatively thin sheet material, such as sheet metal. In this manner, due to sheet material having greater malleability, the countersunk areas of each of the saddle brackets 152 and the vertical support posts 16 provide larger nestable surfaces, thereby enhancing rigidity and load bearing qualities. Additionally, the countersunk apertures 116,166 may each have a non-circular cross-sectional shape in order to prevent rotational movement of one relative to the other. For instance, it is contemplated that the countersunk apertures 116,166 may have any of a variety of non-circular cross-sectional shapes, including a star shape, a triangular shape, a flower shape, a hexagonal shape, and a rectangular shape.

In at least some embodiments of the present invention, improved grounding is provided by a combination of features. As perhaps best shown in FIG. 12, a ground wire 172 may be provided for grounding equipment mounted in the frame structure 12, with one end of the ground wire 172 being fastened and electrically connected to the lower channel 160 of the side cross member 21,22,23 using a fastener 174 and a tooth-based washer, such as a star washer 176 (perhaps best seen in FIG. 3), to break the paint on the cross member 21,22,23. In one contemplated embodiment, the fastener 174 is a self-tapping screw. The saddle bracket 152, in turn, is electrically connected to the vertical support post 16 via the fasteners 170, which include nibs or protrusions 178 on the heads thereof to break the paint on the surface of the support posts 16.

Figure 13:
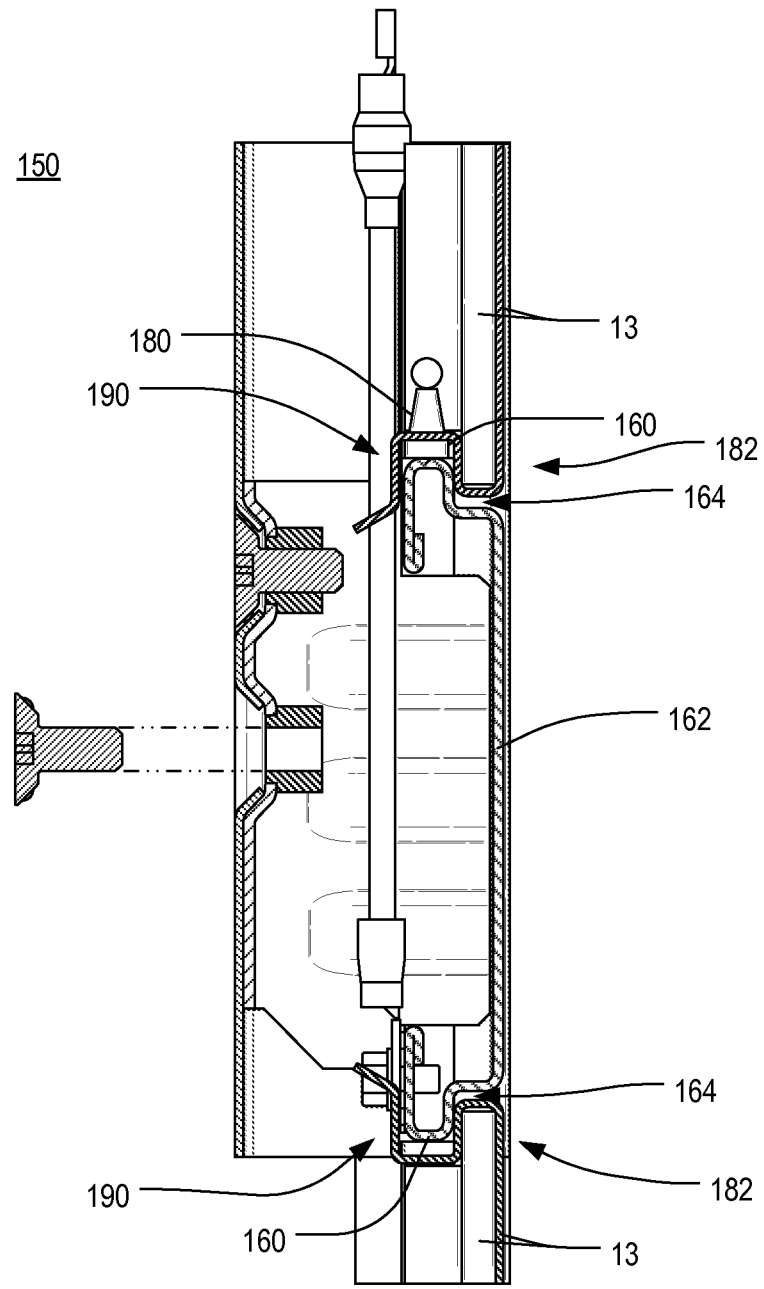
FIG. 13 is a rear fragmentary cross-sectional view, similar to that of FIG. 12, of the side rail assembly of FIG. 10 but with a side panel shown installed thereon.

FIG. 13 is a rear fragmentary cross-sectional view, similar to that of FIG. 12, of the side rail assembly 150 of FIG. 10 but with a side panel 13 shown installed thereon. In particular, the side panel 13 includes an upper panel and a lower panel, each having an edge geometry 182 adapted to interact with an inset portion 164 of the cross member 21,22,23. The edge geometry 182 may have any of wide variety of different configurations. As shown in FIG. 13, the edge geometry 182 may include an S-shaped portion 190 to fittingly correspond with the inset portion 164 of the cross member 21,22,23. An angled portion helps guide the panel 13 into place against and around the respective channel 162. On the upper panel 13 a bumper 180, made for example of rubber or soft plastic, is provided to cushion the bottom of the panel 13 against the cross member 21,22,23. The tortuous path created between the respective geometries 164/162,182 of the cross member 21,22,23 and the side panels 13, as well as the direct contact therebetween, helps improve air sealing between the structures. Additional sealing materials, including compliant materials such as rubber seals, may be added to further improve air sealing.

Figure 14:
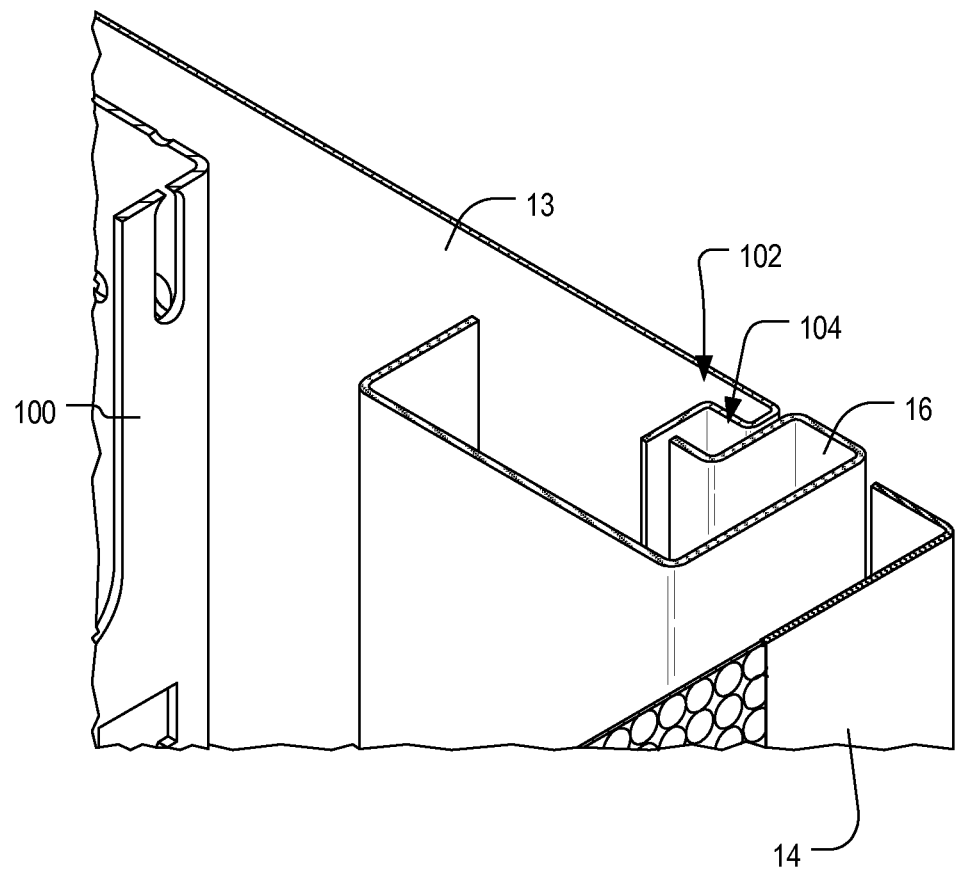
FIG. 14 is an enlarged top fragmentary cutaway view of the top corner of the enclosure of FIG. 5A illustrating the interaction between the side of a side panel and a support post.

FIG. 14 is an enlarged top fragmentary cross-sectional view of the top corner of the enclosure 10 of FIG. 5A illustrating the interaction between the side of a side panel 13 and a support post 16. In particular, the side edge of the side panel 13 includes a geometry 102 adapted to interact and couple with geometry 106 of the support post 16. A gap 104 in between the respective geometries permits foam or other sealing material to be inserted to facilitate an air seal between the support post 16 and the side panel 13.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. An electronic equipment cabinet structure comprising:
    (a) a frame having a plurality of vertical support posts and a plurality of cross members that connect the support posts together; and
    (b) at least one bracket connected to one of the vertical support posts;
    (c) wherein the bracket includes a first embossed portion nested within a corresponding second embossed portion on the vertical support post to which the bracket is connected.

2. The electronic equipment cabinet structure of claim 1, wherein the first embossed portion and the second embossed portion are each made from a sheet metal.

3. The electronic equipment cabinet structure of claim 1, wherein the first embossed portion is nested flush against the second embossed portion, thereby imparting rigidity to the frame.

4. The electronic equipment cabinet structure of claim 3, wherein the first embossed portion includes a countersunk aperture capable of receiving a fastener.

5. The electronic equipment cabinet structure of claim 4, wherein the countersunk aperture accommodates a fastener to retain the first embossed portion flush against the second embossed portion.

6. The electronic equipment cabinet structure of claim 5, wherein the fastener is a countersunk screw.

7. The electronic equipment cabinet structure of claim 6, wherein the countersunk screw includes protrusions thereon to provide an electrical connection between the bracket and the vertical support post to which it is connected.

8. The electronic equipment cabinet structure of claim 5, wherein the fastener is undercut to reduce penetration depth thereof.

9. The electronic equipment cabinet structure of claim 1, wherein each of the first and second embossed portions has a non-circular cross-sectional shape so as to prevent rotation of one of the first and second embossed portions relative to the other.

10. The electronic equipment cabinet structure of claim 9, wherein the non-circular cross-sectional shape is selected from a star shape, a triangular shape, a flower shape, a hexagonal shape, and a rectangular shape.

11. The electronic equipment cabinet structure of claim 1, further comprising a ground wire fastened and electrically connected to the frame with a fastener and a tooth-based washer.

12. The electronic equipment cabinet structure of claim 11, wherein the fastener is a self-tapping screw.

13. The electronic equipment cabinet structure of claim 1, further comprising one or more panels installed on the frame.

14. The electronic equipment cabinet structure of claim 13, wherein one of the one or more panels includes a top panel installed to fit an opening defined by the plurality of vertical support posts and upper ones of the plurality of cross members.

15. The electronic equipment cabinet structure of claim 14, wherein the frame includes a spring pin for latching the top panel.

16. The electronic equipment cabinet structure of claim 1, wherein the first embossed portion and the second embossed portion have corresponding surfaces thereby imparting rigidity between the bracket and the vertical support post when the first embossed portion is nested within the second embossed portion.

17. An electronic equipment cabinet structure comprising:
(a) a frame having a plurality of vertical support posts and a plurality of cross members that connect the support posts together; and
(b) at least one bracket connected to one of the vertical support posts;
(c) wherein the bracket includes a first embossed portion;
(d) wherein the vertical support post includes a second embossed portion; and
(e) wherein the first embossed portion is nested within the second embossed portion.

18. The electronic equipment cabinet structure of claim 17, wherein the first embossed portion includes a countersunk aperture capable of receiving a fastener.

19. The electronic equipment cabinet structure of claim 17, wherein each of the first and second embossed portions has a non-circular cross-sectional shape so as to prevent rotation of one of the first and second embossed portions relative to the other.

20. An electronic equipment cabinet structure comprising:
(a) a frame having a plurality of vertical support posts and a plurality of cross members that connect the support posts together, at least a selected one of the vertical support posts including a first embossed area; and
(b) at least one bracket connected to the selected one of the vertical support posts, the at least one bracket having a second embossed area;
(c) wherein the second embossed area of the at least one bracket extends into a cavity defined by the first embossed area of the selected one of the vertical support posts such that the at least one bracket is seated against the selected one of the vertical support posts, thereby imparting enhanced structural rigidity to the frame.

* * * * *